(12) United States Patent
Kido et al.

(10) Patent No.: US 12,054,657 B2
(45) Date of Patent: Aug. 6, 2024

(54) SEMICONDUCTOR NANOPARTICLE COMPLEX, SEMICONDUCTOR NANOPARTICLE COMPLEX DISPERSION LIQUID, SEMICONDUCTOR NANOPARTICLE COMPLEX COMPOSITION, AND SEMICONDUCTOR NANOPARTICLE COMPLEX CURED FILM

(71) Applicant: SHOEI CHEMICAL INC., Tokyo (JP)

(72) Inventors: Makoto Kido, Tosu (JP); Takafumi Moriyama, Tosu (JP); Hirokazu Sasaki, Tosu (JP)

(73) Assignee: SHOEI CHEMICAL INC., Tokyo (JP)

( * ) Notice: Subject to any disclaimer, the term of this patent is extended or adjusted under 35 U.S.C. 154(b) by 401 days.

(21) Appl. No.: 17/618,768

(22) PCT Filed: May 26, 2020

(86) PCT No.: PCT/JP2020/020686
§ 371 (c)(1),
(2) Date: Dec. 13, 2021

(87) PCT Pub. No.: WO2020/250663
PCT Pub. Date: Dec. 17, 2020

(65) Prior Publication Data
US 2022/0259492 A1 Aug. 18, 2022

(30) Foreign Application Priority Data

Jun. 13, 2019 (JP) .................. 2019-110307
Aug. 1, 2019 (JP) .................. 2019-142425

(51) Int. Cl.
*C09K 11/06* (2006.01)
*C08G 65/32* (2006.01)
(Continued)

(52) U.S. Cl.
CPC .............. *C09K 11/06* (2013.01); *C08G 65/32* (2013.01); *C09K 11/565* (2013.01); *C09K 11/70* (2013.01);
(Continued)

(58) Field of Classification Search
CPC ... H01B 1/00; H01B 1/06; H01B 1/10; C08G 65/32; C08K 9/04; C09K 11/06
See application file for complete search history.

(56) References Cited

U.S. PATENT DOCUMENTS

| | | | |
|---|---|---|---|
| 11,072,872 B2 * | 7/2021 | Ono ...................... | C09K 11/70 |
| 2019/0112527 A1 * | 4/2019 | Moriyama ........... | C09K 11/883 |
| 2022/0308274 A1 * | 9/2022 | Kido .................... | C08L 101/00 |

FOREIGN PATENT DOCUMENTS

| | | |
|---|---|---|
| CN | 106479503 A | 3/2017 |
| CN | 109075222 A | 12/2018 |

(Continued)

OTHER PUBLICATIONS

Palui et al."Polymers for Surface-Functionalization and Biocompatibility of Inorganic Nanocrystals" Chapter Sep. 2013 DOI: 10.1002/0471440264.pst608 (pp. 785-810).*

(Continued)

*Primary Examiner* — Mark Kopec
(74) *Attorney, Agent, or Firm* — Alleman Hall & Tuttle LLP

(57) ABSTRACT

Provided is a semiconductor nanoparticle complex in which a ligand is coordinated to a surface of a semiconductor nanoparticle. The semiconductor nanoparticle is a core-shell type semiconductor nanoparticle including a core containing In and P and one or more layers of shells. The semiconductor nanoparticle further includes halogen and the molar ratio of halogen to In is 0.80 to 15.00 in terms of atoms. The ligand includes one or more kinds of mercapto fatty acid esters represented by the following general formula: HS—$R_1$—COO—$R_2$. The mercapto fatty acid ester has an SP value of 9.20 or more. The mercapto fatty acid ester has a molecular weight of 700 or less, and the average SP value of the entire ligand is 9.10 to 11.00. The present invention provides a semiconductor nanoparticle complex dispersible at a high mass fraction in a polar dispersion medium while keeping high fluorescence quantum yield.

20 Claims, 1 Drawing Sheet

(51) Int. Cl.
- *C09K 11/56* (2006.01)
- *C09K 11/70* (2006.01)
- *C09K 11/88* (2006.01)
- *H01B 1/06* (2006.01)
- *B82Y 20/00* (2011.01)
- *H01L 33/50* (2010.01)

(52) U.S. Cl.
CPC .............. *C09K 11/883* (2013.01); *H01B 1/06* (2013.01); *B82Y 20/00* (2013.01); *H01L 33/502* (2013.01)

(56) References Cited

FOREIGN PATENT DOCUMENTS

| | | | |
|---|---|---|---|
| JP | 2002121549 A | 4/2002 | |
| JP | 2002162501 A | 6/2002 | |
| JP | 2013136498 A | 7/2013 | |
| WO | 2017188300 A1 | 11/2017 | |
| WO | 2018016589 A1 | 1/2018 | |
| WO | 2018224459 A1 | 12/2018 | |

OTHER PUBLICATIONS

Dubois, F. et al., "A Versatile Strategy for Quantum Dot Ligand Exchange," Journal of the American Chemical Society, vol. 129, No. 3, Dec. 23, 2006, 2 pages.

Jin, T., "Semiconductor quantum dots: their synthesis and application to bioscience," Production and Technology, vol. 63, No. 2, 2011, 13 pages (Submitted with machine translation).

Pong, B. et al., "Modified Ligand-Exchange for Efficient Solubilization of CdSe/ZnS Quantum Dots in Water: A Procedure Guided by Computational Studies," Langmuir, vol. 24, Apr. 16, 2008, 7 pages.

Rahman, S. et al., "Thiolate-Capped CdSe/ZnS Core-Shell Quantum Dots for the Sensitive Detection of Glucose," Sensors, vol. 17, No. 7, Jul. 1, 2017, 12 pages.

Wenger, W. et al., "Functionalization of cadmium selenide quantum dots with poly(ethylene glycol): Ligand exchange, surface coverage, and dispersion stability," Langmuir, vol. 33, Aug. 2, 2017, 25 pages.

Taiwan Intellectual Property Office, Office Action and Search Report Issued in Application No. 11220843500, Aug. 30, 2023, 26 pages.

* cited by examiner

SEMICONDUCTOR NANOPARTICLE COMPLEX, SEMICONDUCTOR NANOPARTICLE COMPLEX DISPERSION LIQUID, SEMICONDUCTOR NANOPARTICLE COMPLEX COMPOSITION, AND SEMICONDUCTOR NANOPARTICLE COMPLEX CURED FILM

TECHNICAL FIELD

The present invention relates to a semiconductor nanoparticle complex.

BACKGROUND ART

Semiconductor nanoparticles small enough to exhibit quantum confinement effects have a bandgap (Quantum Dot, QD) dependent on the particle size. An exciton formed in a semiconductor nanoparticle by such means as photoexcitation or charge injection emits a photon having energy depending on the bandgap due to recombination. Emission having a desired wavelength therefore can be obtained by selecting the composition of semiconductor nanoparticles and their particle size as appropriate.

Early research on semiconductor nanoparticles focused on elements including Cd and Pb. However, since Cd and Pb are substances under regulations such as Restriction on Hazardous Substances, more recent studies have shifted to non-Cd or non-Pb semiconductor nanoparticles.

Semiconductor nanoparticles find various applications such as displays, biological labeling, and solar cells. As for display applications, it is expected to be used in QD films, QD patterning, and self-illuminating devices (QLED), for example.

FIG. 2 schematically illustrates a device configuration for converting the wavelength from a light source in a conventional display. As illustrated in FIG. 2, a blue LED 101 is used as a light source, and blue light is converted into white light. A QD film 102 is suitably used for conversion from blue light to white light. The QD film 102 is formed by dispersing semiconductor nanoparticles in a resin and making a film having a thickness of about 100 μm. White light produced by a wavelength conversion layer such as the QD film 102 is further converted by a color filter (R) 104, a color filter (G) 105, and a color filter (B) 106 into red light, green light, and blue light, respectively. In FIG. 2, a polarizing plate is omitted.

As illustrated in FIG. 1, a display including QD patterning instead of a QD film as a wavelength conversion layer has recently been developed (a polarizing plate is not illustrated). In the display of the type illustrated in FIG. 1, QD patterning (7, 8) directly converts blue light into red light or blue light into green light, rather than converting blue light from the blue LED 1 serving as a light source into white light. The QD patterning (7, 8) is formed by patterning semiconductor nanoparticles dispersed in a resin and has a thickness of 5 μm to 10 μM because of structural limitations of displays. Blue light from the blue LED 1 serving as a light source is transmitted through a diffusion layer 9 containing a diffusion agent, and the transmitted light is used as blue.

CITATION LIST

Patent Literature

Patent Literature 1: Japanese Patent Application Laid-open No. 2013-136498

Non-Patent Literature

Non-Patent Literature 1: Jin Takashi, "Semiconductor quantum dots: their synthesis and application to bioscience", Manufacturing & Technology Vol. 63, No. 2, pp. 58-63, 2011

Non-Patent Literature 2: Fabien Dubois et al., "A Versatile Strategy for Quantum Dot Ligand Exchange" J. AM. CHEM. SOC Vol. 129, No. 3, pp. 482-483, 2007

Non-Patent Literature 3: Boon-Kin Pong et al., "Modified Ligand-Exchange for Efficient Solubilization of CdSe/ZnS Quantum Dots in Water: A Procedure Guided by Computational Studies" Langmuir Vol. 24, No. 10, pp. 5270-5276, 2008

Non-Patent Literature 4: Samsulida Abd. Rahman et al., "Thiolate-Capped CdSe/ZnS Core-Shell Quantum Dots for the Sensitive Detection of Glucose" Sensors Vol. 17, No. 7, p. 1537, 2017

Non-Patent Literature 5: Whitney Nowak Wenger et al, "Functionalization of Cadmium Selenide Quantum Dots with Poly(ethylene glycol): Ligand Exchange, Surface Coverage, and Dispersion Stability" Langmuir, Vol. 33, No. 33, pp. 8239-8245, 2017

SUMMARY OF INVENTION

Technical Problem

Semiconductor nanoparticles and a semiconductor nanoparticle complex are typically dispersed in a dispersion medium to be prepared as a dispersion liquid to be applied in various fields. In particular, in display applications, a dispersion liquid in which semiconductor nanoparticles are dispersed in a polar organic dispersion medium such as glycol ethers and glycol ether esters is used, and the dispersion liquid is cured to form a cured film such as a QD film and QD patterning. In order to enhance wavelength conversion efficiency, it is desirable that the mass fraction of semiconductor nanoparticles in the cured film be high.

Semiconductor nanoparticles and a semiconductor nanoparticle complex synthesized in a nonpolar dispersion medium are hydrophobic and easily dispersed in a nonpolar dispersion medium, but dispersion in a polar dispersion medium has been difficult.

Semiconductor nanoparticles and a semiconductor nanoparticle complex synthesized in a nonpolar dispersion medium are presumed to have weak dipole-dipole force and hydrogen bonding force. The semiconductor nanoparticles therefore can be dispersed in toluene and chloroform having weak dipole-dipole force and hydrogen bonding, among polar dispersion media, in the same manner as semiconductor nanoparticles synthesized in an organic solvent. These polar dispersion media, however, are toxic and not practical.

A ligand exchange method is known as a method for making semiconductor nanoparticles dispersible in a polar dispersion medium. The ligand exchange method is a method that involves replacing a ligand included in a semiconductor nanoparticle complex obtained by bonding the ligand to a surface of a semiconductor nanoparticle, with a ligand having a hydrophilic group. The resultant semiconductor nanoparticle complex can be dispersed in a polar dispersion medium. The semiconductor nanoparticle complexes disclosed in Non-Patent Literature 1 to Non-Patent Literature 5 and Patent Literature 1 enable dispersion of semiconductor nanoparticles in a polar dispersion medium but unfortunately suffer from deterioration in luminous efficiency.

Encapsulation is another known method for making semiconductor nanoparticles dispersible in a polar dispersion medium. In the encapsulation, a semiconductor nanoparticle complex obtained by bonding a ligand to a surface of a semiconductor nanoparticle is additionally coated with an amphiphilic polymer. This method increases the amount of a dispersant relative to the semiconductor nanoparticles, makes it difficult to increase the mass fraction of semiconductor nanoparticles, and therefore is difficult to apply.

Based on the above, there is a demand for a semiconductor nanoparticle complex dispersible at a high mass fraction in a polar dispersion medium while keeping high fluorescence quantum yield (QY) of semiconductor nanoparticles.

When cured films such as QD films and QD patterning are formed, any curing method can be used for curing the dispersion liquid. However, when the curing method is thermal curing, heat is applied to a dispersion liquid of the semiconductor nanoparticle complex, and the semiconductor nanoparticles and the semiconductor nanoparticle complex therefore require heat resistance.

When a cured film such as a QD film and QD patterning is formed, any curing method can be used for curing the dispersion liquid. However, the dispersion liquid is sometimes required to have a low viscosity depending on the curing method (for example, for inkjet).

An object of the present invention is therefore to provide a semiconductor nanoparticle complex dispersible at a high mass fraction in a polar dispersion medium while keeping high fluorescence quantum yield (QY) of semiconductor nanoparticles. Another object of the present invention is to provide a semiconductor nanoparticle complex having high heat resistance and being useful in applications that require heat resistance, in addition to being dispersible at a high mass fraction in a polar dispersion medium while keeping high fluorescence quantum yield (QY) of semiconductor nanoparticles. Another object of the present invention is to provide a semiconductor nanoparticle complex dispersed in a dispersion medium to provide a dispersion liquid having a low viscosity and being useful in applications that require a low viscosity of a dispersion liquid, in addition to being dispersible at a high mass fraction in a polar dispersion medium while keeping high fluorescence quantum yield (QY) of semiconductor nanoparticles.

Solution to Problem

The problems above are solved by the present invention as follows.

A semiconductor nanoparticle complex (1) according to the present invention is a semiconductor nanoparticle complex comprising a ligand coordinated to a surface of a semiconductor nanoparticle, in which
the semiconductor nanoparticle is a core-shell type semiconductor nanoparticle including a core containing In and P and one or more layers of shells,
the semiconductor nanoparticle further includes halogen, in the semiconductor nanoparticle, a molar ratio of halogen to In is 0.80 to 15.00 in terms of atoms,
the ligand includes one or more kinds of mercapto fatty acid esters represented by following general formula (1);

 HS—$R_1$—COO—$R_2$ (1)

(where $R_1$ is a $C_{1-3}$ alkylene group and $R_2$ is a hydrophilic group), the mercapto fatty acid ester has an SP value of 9.20 or more, the mercapto fatty acid ester has a molecular weight of 700 or less, and an average SP value of the entire ligand is 9.10 to 11.00.

The present invention (2) provides the semiconductor nanoparticle complex according to (1), in which the mercapto fatty acid ester represented by the general formula (1) has a molecular weight of 300 or more and 700 or less.

The present invention (3) provides the semiconductor nanoparticle complex according to (1), in which the mercapto fatty acid ester represented by the general formula (1) has a molecular weight of 300 or more and 600 or less.

The present invention (4) provides the semiconductor nanoparticle complex according to (2) or (3), in which a mass ratio of the ligand to the semiconductor nanoparticle (ligand/semiconductor nanoparticle) is 1.00 or less.

The present invention (5) provides the semiconductor nanoparticle complex according to (2) or (3), in which a mass ratio of the ligand to the semiconductor nanoparticle (ligand/semiconductor nanoparticle) is 0.70 or less.

The present invention (6) provides the semiconductor nanoparticle complex according to any one of (2) to (5), in which a mass ratio of the ligand to the semiconductor nanoparticle (ligand/semiconductor nanoparticle) is 0.40 or more.

The present invention (7) provides the semiconductor nanoparticle complex according to (1), in which the mercapto fatty acid ester represented by the general formula (1) has a molecular weight of less than 300.

The present invention (8) provides the semiconductor nanoparticle complex according to (7), in which a mass ratio of the ligand to the semiconductor nanoparticle (ligand/semiconductor nanoparticle) is 0.40 or less.

The present invention (9) provides the semiconductor nanoparticle complex according to any one of (1) to (8), in which an amount of the mercapto fatty acid ester represented by the general formula (1) contained in the entire ligand is 40 mol % or more.

The present invention (10) provides the semiconductor nanoparticle complex according to any one of (1) to (8), in which an amount of the mercapto fatty acid ester represented by the general formula (1) contained in the entire ligand is 50 mol % or more.

The present invention (11) provides the semiconductor nanoparticle complex according to any one of (1) to (8), in which an amount of the mercapto fatty acid ester represented by the general formula (1) contained in the entire ligand is 60 mol % or more.

The present invention (12) provides the semiconductor nanoparticle complex according to any one of (1) to (11), in which at least one of the shells is formed of ZnSe.

The present invention (13) provides the semiconductor nanoparticle complex according to any one of (1) to (12), in which the shells are two or more layers, and an outermost layer of the shells is formed of ZnS.

The present invention (14) provides the semiconductor nanoparticle complex according to any one of (1) to (13), in which the shells at least include a first shell formed of ZnSe and covering an outer surface of the core and a second shell formed of ZnS and covering an outer surface of the first shell.

The present invention (15) provides the semiconductor nanoparticle complex according to any one of (1) to (14), in which $R_2$ in the general formula (1) is any one selected from the group consisting of an oligoethylene glycol group, a polyethylene glycol group, and an alkoxy group.

The present invention (16) provides the semiconductor nanoparticle complex according to any one of (1) to (15), in which a terminal group not bonded to a carboxy group in $R_2$ in the general formula (1) is any one selected from the group consisting of an alkyl group, an alkenyl group, and an alkynyl group.

The present invention (17) provides the semiconductor nanoparticle complex according to any one of (1) to (16), in which the ligand further includes an aliphatic ligand.

The present invention (18) provides the semiconductor nanoparticle complex according to (17), in which the aliphatic ligand comprises one or more kinds selected from the group consisting of aliphatic thiols, aliphatic carboxylic acids, and aliphatic phosphines.

The present invention (19) provides the semiconductor nanoparticle complex according to any one of (1) to (18), in which quantum yield after purification of the semiconductor nanoparticle complex is 80% or higher.

The present invention (20) provides the semiconductor nanoparticle complex according to any one of (1) to (19), in which a full width at half maximum of an emission spectrum of the semiconductor nanoparticle complex is 38 nm or less.

The present invention (21) provides a semiconductor nanoparticle complex dispersion liquid comprising the semiconductor nanoparticle complex according to any one of (1) to (20) dispersed in an organic dispersion medium.

The present invention (22) provides a semiconductor nanoparticle complex composition comprising the semiconductor nanoparticle complex according to any one of (1) to (20) dispersed in a monomer or a prepolymer.

The present invention (23) provides a semiconductor nanoparticle complex cured film comprising the semiconductor nanoparticle complex according to any one of (1) to (20) dispersed in a polymer matrix.

The present invention (24) provides a semiconductor nanoparticle complex obtained by bringing a surface-modifying compound into contact with a semiconductor nanoparticle, the surface-modifying compound having a bonding group to be bonded to the semiconductor nanoparticle at one end side, the semiconductor nanoparticle being a core-shell type semiconductor nanoparticle including a core containing In and P and one or more layers of shells and further including halogen, a molar ratio of halogen to in being 0.80 to 15.00 in terms of atoms, in which the surface-modifying compound includes one or more kinds of mercapto fatty acid esters represented by following general formula (1):

(where $R_1$ is a alkylene group and $R_2$ is a hydrophilic group),
the mercapto fatty acid ester has an SP value of 9.20 or more, the mercapto fatty acid ester has a molecular weight of 700 or less, and
an average SP value of the entire surface-modifying compound is 9.10 to 11.00.

The present invention (25) provides the semiconductor nanoparticle complex according to (24), in which the surface-modifying compound further includes an aliphatic group-containing surface-modifying compound having a bonding group to be bonded to the semiconductor nanoparticle at one end side and an aliphatic group at another end side.

In the subject application, the range denoted by "to" is a range in which both the starting and ending values are inclusive.

Advantageous Effects of Invention

The present invention can provide a semiconductor nanoparticle complex dispersible at a high mass fraction in a polar dispersion medium while keeping high fluorescence quantum yield (QY) of semiconductor nanoparticles. The present invention can also provide a semiconductor nanoparticle complex having high heat resistance and being useful in applications that require heat resistance, in addition to being dispersible at a high mass fraction in a polar dispersion medium while keeping high fluorescence quantum yield (QY) of semiconductor nanoparticles. The present invention can also provide a semiconductor nanoparticle complex dispersed in a dispersion medium to provide a dispersion liquid having a low viscosity and being useful in applications that require a low viscosity of a dispersion liquid, in addition to being dispersible at a high mass fraction in a polar dispersion medium while keeping high fluorescence quantum yield (QY) of semiconductor nanoparticles.

Figure 1:
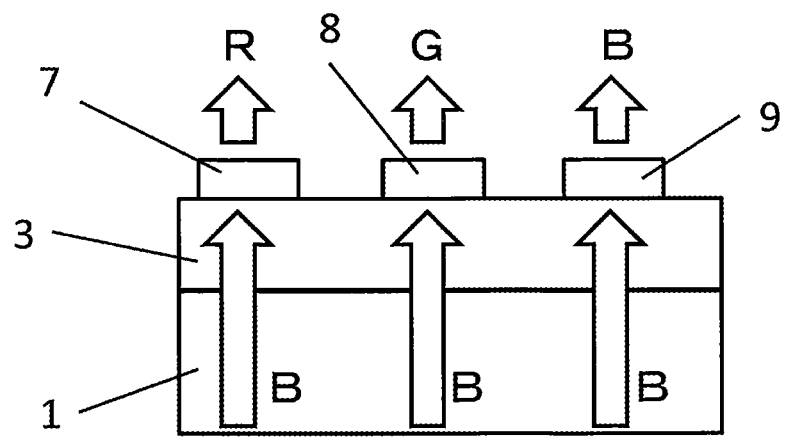
FIG. 1 is a schematic diagram illustrating a QD device.
Figure 2:
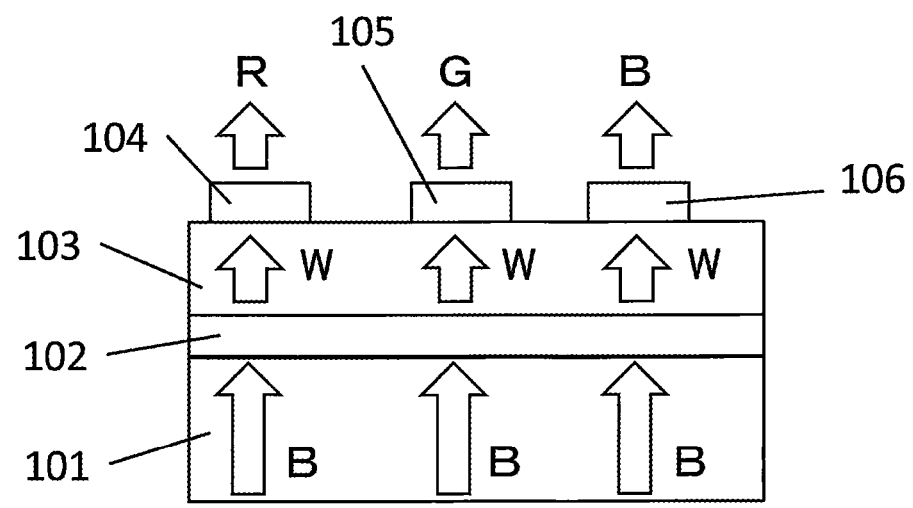
FIG. 2 is a schematic diagram illustrating a QD device.

DESCRIPTION OF EMBODIMENTS (Semiconductor Nanoparticle Complex)
A semiconductor nanoparticle complex (A) according to the present invention is a semiconductor nanoparticle complex in which a ligand is coordinated to a surface of a semiconductor nanoparticle, in which
the semiconductor nanoparticle is a core-shell type semiconductor nanoparticle including a core containing In and P and one or more layers of shells,
the semiconductor nanoparticle further includes halogen, in the semiconductor nanoparticle, the molar ratio of halogen to In is 0.80 to 15.00 in terms of atoms, the ligand includes one or more kinds of mercapto fatty acid esters represented by the following general formula (1):

(where $R_1$ is a $C_{1-3}$ alkylene group and $R_2$ is a hydrophilic group),
the mercapto fatty acid ester has an SP value of 9.20 or more, the mercapto fatty acid ester has a molecular weight of 700 or less, and
the average SP value of the entire ligand is 9.10 to 11.00.

The semiconductor nanoparticle complex according to the present invention is a complex of a semiconductor nanoparticle and a ligand, in which the ligand is coordinated to a surface of the semiconductor nanoparticle. The semiconductor nanoparticle complex according to the present invention is obtained by bringing a semiconductor nanoparticle and a ligand into contact with each other.

In the present invention, the semiconductor nanoparticle complex refers to a semiconducting nanoparticle complex having luminous properties. The semiconductor nanoparticle complex according to the present invention is a particle that absorbs light of 340 nm to 480 nm and emits light having an emission peak wavelength of 400 nm to 750 nm.

The full width at half maximum (FWHM) of an emission spectrum of the semiconductor nanoparticle complex according to the present invention is preferably 38 nm or less, and further preferably 35 nm or less. With the full width at half maximum of the emission spectrum falling within the range above, color mixture can be reduced when the semiconductor nanoparticle complex is applied to displays and the like.

The fluorescence quantum yield (QY) of the semiconductor nanoparticle complex according to the present invention is preferably 80% or higher, and more preferably 85% or higher. With the fluorescence quantum yield of the semiconductor nanoparticle complex of 80% or higher, color conversion can be performed more efficiently when the semiconductor nanoparticle is used in applications.

In the present invention, the optical properties of the semiconductor nanoparticle complex can be determined using a quantum yield measurement system. The semiconductor nanoparticle complex is dispersed in a dispersion liquid and irradiated with excitation light to obtain an emission spectrum. The re-excitation fluorescence emission spectrum of re-excited fluorescence emission is eliminated from the obtained emission, and the fluorescence quantum yield (QY) and the full width at half maximum (FWHM) are calculated from the emission spectrum after the re-excitation correction. Examples of the dispersion liquid include n-hexane, PGMEA, and chloroform.

(Semiconductor Nanoparticle)

The semiconductor nanoparticle composing the semiconductor nanoparticle complex according to the present invention is a core-shell type semiconductor nanoparticle including a core containing In and P and one or more layers of shells. The semiconductor nanoparticle includes at least one layer of shell. Examples of the semiconductor nanoparticle include a core-shell type semiconductor nanoparticle including a core and one layer of shell, a core-shell type semiconductor nanoparticle including a core and two layers of shells, and a core-shell type semiconductor nanoparticle including a core and three or more layers of shells. In particular, with two or more layers of shells, the fluorescence quantum yield of the semiconductor nanoparticles can be retained, and the semiconductor nanoparticle complex can have high fluorescence quantum yield. The semiconductor nanoparticle has any structure as long as the shell covers at least a part of the surface of the core. However, a structure in which the shell covers the entire surface of the core is preferable, and a structure in which the shell uniformly covers the entire surface of the core is particularly preferable.

The shells preferably include a shell of a composition containing Zn and Se, and at least one of the shells is preferably formed of ZnSe. When the semiconductor nanoparticle has two or more layers of shells, the outermost layer is preferably a shell of a composition containing Zn and S, and further preferably formed of ZnS.

In particular, when the shells at least include a first shell formed of ZnSe and covering an outer surface of the core particle and a second shell formed of ZnS and covering an outer surface of the first shell, the fluorescence quantum yield can be enhanced.

The composition in the shells is not necessarily a stoichiometric composition unless the advantageous effect of the present invention is impaired, and may include an element other than Zn, Se, and S in each shell or may have one or more gradient-type shells in which the ratio of an element composing the shell varies in the shell.

In the present invention, whether the shell covers at least a part of the core and the elemental distribution in the shell can be determined, for example, by compositional analysis using energy dispersive X-ray spectroscopy (TEM-EDX) using a transmission electron microscope.

The semiconductor nanoparticle in the semiconductor nanoparticle complex according to the present invention includes halogen. The molar ratio of halogen to In in the semiconductor nanoparticle is 0.80 to 15.00, and preferably 1.00 to 15.00, in terms of atoms. The halogen contained in the semiconductor nanoparticle is preferably F, Cl, or Br. When the semiconductor nanoparticle includes halogen within the range above, high fluorescence quantum yield and a narrow full width at half maximum can be obtained, and production of an aggregate can be suppressed in synthesis of the semiconductor nanoparticle complex described later. The effect described above is more prominent when halogen is present at an interface between the core and the shell of the semiconductor nanoparticle and/or in the shell of the semiconductor nanoparticle.

In the semiconductor nanoparticle in the semiconductor nanoparticle complex according to the present invention, the molar ratio of P to In is preferably 0.20 to 0.95 in terms of atoms. The molar ratio of Zn to In is preferably 10.00 to 60.00 in terms of atoms.

The elements that compose the semiconductor nanoparticle can be analyzed using an inductively coupled plasma spectroscope (ICP) or an X-ray fluorescence spectrometer (XRF).

An exemplary method of producing semiconductor nanoparticles will be disclosed below.

The core of a semiconductor nanoparticle can be formed by mixing an In precursor, a P precursor, and an additive, if necessary, in a solvent and heating the resultant precursor mixture. A coordinating solvent or a non-coordinating solvent is used as the solvent. Examples of the solvent include 1-octadecene, hexadecane, squalane, oleylamine, trioctylphosphine, and trioctylphosphine oxide.

Examples of the In precursor include, but not limited to, acetates, carboxylases, and halides containing the In.

Examples of the P precursor include, but not limited to, organic compounds and gases including the P. When the precursor is gas, the core can be formed by allowing the precursor mixture excluding the gas to react while injecting the gas.

The semiconductor nanoparticle may include one or more kinds of elements other than In and P as long as the advantageous effects of the present invention are not impaired, and in this case, the precursor of the element is added when the core is formed. Examples of the additive include, but not limited to, dispersants such as carboxylic acids, amines, thiols, phosphines, phosphine oxides, phosphinic acids, and phosphonic acids. The dispersant may also serve as a solvent.

After the core of the semiconductor nanoparticle is formed, a halide can be added, if necessary, to improve the luminous properties of the semiconductor nanoparticle.

In an embodiment, a precursor solution including an In precursor, and, if necessary, a dispersant added in a solvent is mixed under vacuum and temporarily heated at 100° C. to 300° C. for 6 hours to 24 hours. Subsequently, a P precursor is added, and the mixture is heated at 200° C. to 400° C. for 3 minutes to 60 minutes and thereafter cooled. Furthermore, a halogen precursor is added, and the mixture is heated at 25° C. to 300° C., preferably 100° C. to 300° C., and more preferably 150° C. to 280° C., resulting in a core particle dispersion liquid including core particles.

To the synthesized core particle dispersion liquid, a shell-forming precursor is added, whereby the semiconductor nanoparticle attains a core-shell structure, and the fluorescence quantum yield (QY) and the stability can be enhanced.

The element forming the shell presumably takes a structure such as an alloy or hetero structure or an amorphous structure on the surface of the core particle but may partially move to the interior of the core particle by diffusion.

The added shell-forming element is mainly present in the vicinity of the surface of the core particle and plays a role of protecting the semiconductor nanoparticle from external factors. In the core-shell structure of the semiconductor nanoparticle, the shell preferably covers at least a part of the core, and further preferably uniformly covers the entire surface of the core particle.

In an embodiment, after a Zn precursor and a Se precursor are added to the core particle dispersion liquid, the dispersion liquid is heated at 150° C. to 300° C., and preferably at 180° C. to 250° C., and thereafter a Zn precursor and a S precursor are added, and the dispersion liquid is heated at 200° C. to 400° C., and preferably at 250° C. to 350° C. The core-shell type semiconductor nanoparticle thus can be obtained.

As the Zn precursor, carboxylates such as zinc acetate, zinc propionate, and zinc myristate, halides such as zinc chloride and zinc bromide, organic salts such as diethyl zinc, and the like can be used although not limited thereto.

As the Se precursor, phosphine selenides such as tributylphosphine selenide, trioctylphosphine selenide, and tris(trimethylsilyl)phosphine selenide, selenols such as benzeneselenol and selenocysteine, a selenium/octadecene solution, and the like can be used.

As the S precursor, phosphine sulfides such as tributylphosphine sulfide, trioctylphosphine sulfide, and tris (trimethylsilyl)phosphine sulfide, thiols such as octanethiol, dodecanethiol, and octadecanethiol, a sulfur/octadecene solution, and the like can be used.

The precursors of the shell may be mixed in advance and added at one time or multiple times or may be added separately at one time or separately multiple times. When the shell precursors are added multiple times, the temperature may be changed for heating after each addition of the shell precursors.

In the present invention, the method of preparing semiconductor nanoparticles is not limited. Besides the method described above, conventional production methods such as hot injection, a homogeneous solvent method, an inverse micelle method, and CVD, or any methods may be employed.

(Ligand)

In the semiconductor nanoparticle complex according to the present invention, a ligand is coordinated to the surface of the semiconductor nanoparticle. As used herein coordination means that a ligand chemically affects the surface of the semiconductor nanoparticle. A ligand may be bonded to the surface of the semiconductor nanoparticle by coordinate bonding or any other forms of bonding (for example, covalent bonding, ionic bonding, or hydrogen bonding), or the bond is not necessarily formed when at least a part of the surface of the semiconductor nanoparticle has a ligand.

In the semiconductor nanoparticle complex according to the present invention, the ligand coordinated to the semiconductor nanoparticle includes a mercapto fatty acid ester represented by the following general formula (1).

   (1)

In general formula (1), $R_1$ is a $C_{1-3}$ alkylene group and $R_2$ is a hydrophilic group. Specifically, the mercapto fatty acid ester represented by general formula (1) is a compound in which —SH is bonded to one end of $R_1$ and —COO—$R_2$ is bonded to the other end. In the semiconductor nanoparticle complex according to the present invention, the ligand coordinated to the semiconductor nanoparticle may include one kind of mercapto fatty acid ester represented by general formula (1) or may include two or more kinds of mercapto fatty acid esters represented by general formula (1).

Since the mercapto fatty acid ester represented by general formula (1) is coordinated to the semiconductor nanoparticle, the semiconductor nanoparticle complex having high fluorescence quantum yield and a narrow full width at half maximum can be obtained.

In general formula (1), examples of $R_1$ include a methylene group (—$CH_2$—), an ethylene group (—$CH_2CH_2$—), a propylene group (—$CH_2CH_2CH_2$—), a methyl ethylene group (—$CH(CH_3)$—), and a dimethyl methylene group (—$C(CH_3)_2$—).

In general formula (1), $R_2$ is any hydrophilic group, and examples thereof include hydrophilic groups containing groups such as an alkyl group, an alkynyl group, an alkenyl group, an alkoxy group, a hydroxy group, an aldehyde group, a carboxy group, an amino group, an imino group, a nitro group, a cyano group, a vinyl group, an aryl group, a halogen group, a ketone group, an ether bond, an ester bond, and a siloxane bond. $R_2$ is preferably a hydrophilic group having an oligoethylene glycol group, a polyethylene glycol group, or an alkoxy group, and particularly preferably an oligoethylene glycol group or a polyethylene glycol group. When $R_2$ is a hydrophilic group having an oligoethylene glycol group, a polyethylene glycol group, or an alkoxy group, the semiconductor nanoparticles can be dispersed at a high concentration in a polar solvent. Furthermore, in general formula (1), it is preferable that a terminal group on the side not bonded to a carboxy group in $R_2$ be any one selected from the group consisting of an alkyl group, an alkenyl group, and an alkynyl group. When a terminal group on the side not bonded to a carboxy group in $R_2$ is any one selected from the group consisting of an alkyl group, an alkenyl group, and an alkynyl group, interaction between semiconductor nanoparticle complexes can be suppressed, and the semiconductor nanoparticles can be dispersed at a high concentration in a polar solvent.

The molecular weight of the mercapto fatty acid ester represented by general formula (1) is 700 or less. When the molecular weight of the mercapto fatty acid ester represented by general formula (1) is 700 or less, the semiconductor nanoparticles can be dispersed at a high concentration in a polar solvent.

In the present invention, the molecular weight of the mercapto fatty acid ester represented by the general formula (1) refers to the average molecular weight of the mercapto fatty acid ester represented by general formula (1). The average molecular weight of the mercapto fatty acid ester represented by general formula (1) is determined using gel permeation chromatography (GPC), and the number average of the measured values is considered as the average molecular weight (number average molecular weight Mn).

The SP value of the mercapto fatty acid ester represented by general formula (1) is 9.20 or more, and preferably 9.20 to 12.00. With the SP value within the range above, the semiconductor nanoparticles can be dispersed in a polar solvent. Here, the SP value is determined by calculation using the Y-MB method. In the present invention, when two or more kinds of mercapto fatty acid esters represented by general formula (1) are used as ligands, the SP value of each mercapto fatty acid ester is multiplied by the volume fraction of the mercapto fatty acid ester, and then the sum of SP values is set as the SP value of the mercapto fatty acid esters. For example, when $P_1$ vol % of a mercapto fatty acid ester having an SP value $A_1$, $P_2$ vol % of a mercapto fatty acid ester having an SP value $A_2$, and the like are coordinated to the semiconductor nanoparticle, the mercapto fatty acid ester SP value is represented by the following formula (2).

The SP value of mercapto fatty acid ester=Σ(Ai×Pi/100) (2)

The semiconductor nanoparticle complex according to the present invention can include a ligand other than the mercapto fatty acid ester represented by general formula (1), as a ligand. Such a ligand other than the mercapto fatty acid ester represented by general formula (1) may be any compound having a bonding group to be coordinated to the semiconductor nanoparticle at one end side, and which can be used as a compound coordinated to the semiconductor nanoparticle and can adjust the average SP value of the entire ligand to 9.20 to 11.00, and preferably 9.20 to 10.00, in combination with the mercapto fatty acid ester represented by general formula (1).

The SP value of the ligand other than the mercapto fatty acid ester represented by general formula (1) is preferably, but not limited to, 7.50 to 15.00, and particularly preferably 7.50 to 15.00.

The average SP value of the entire ligand coordinated to the semiconductor nanoparticle is 9.20 to 11.00, and preferably 9.20 to 10.00. When the average SP value of the entire ligand coordinated to the semiconductor nanoparticle falls within the range above, the semiconductor nanoparticles can be dispersed in a polar solvent. The SP value of the ligand can be calculated from the structural formula using the Y-MB method. When different kinds of ligands are coordinated to the semiconductor nanoparticle, the SP value of each ligand is multiplied by the volume fraction of the ligand and then the average SP value of the sum of total ligands is set as the SP value of the ligands. For example, when $P_1$ vol % of a ligand having an SP value $A_1$, $P_2$ vol % of a ligand having an SP value and the like are coordinated to the semiconductor nanoparticle, the average SP value of total ligands is represented by the following formula (3).

The average SP value of total ligands=Σ(Ai×Pi/100) (3)

The ligand other than the mercapto fatty acid ester represented by general formula (1) is preferably an aliphatic ligand. With inclusion of an aliphatic ligand as a ligand, the semiconductor nanoparticles can be dispersed at a high concentration in a polar solvent. Furthermore, the semiconductor nanoparticles can be dispersed in an organic solvent with an SP value in a wider range. When the semiconductor nanoparticle complex is applied to a composition and a dispersion liquid described later, the choice of the dispersion medium can be widened.

Examples of the aliphatic ligand include aliphatic thiols, aliphatic carboxylic acids, aliphatic phosphines, aliphatic phosphine oxides, and aliphatic amines. The aliphatic ligand is preferably one or more kinds selected from the group consisting of aliphatic thiols, aliphatic carboxylic acids, and aliphatic phosphines in terms of the strength of coordination force to the semiconductor nanoparticle. The aliphatic group of the aliphatic ligand may include a substituent or a heteroatom.

The amount of the mercapto fatty acid ester represented by the general formula (1) contained in the entire ligand is preferably 40 mol % or more, more preferably 50 mol % or more, and further preferably 60 mol % or more. When the amount of the mercapto fatty acid ester represented by general formula (1) contained in the entire ligand falls within the range above, the semiconductor nanoparticles can be dispersed at a high concentration in a polar solvent, and the quantum yield can be enhanced.

The semiconductor nanoparticle complex (A) according to the present invention includes the following first mode. The first mode of the semiconductor nanoparticle complex (A) according to the present invention is the semiconductor nanoparticle complex (A) according to the present invention in which the mercapto fatty acid ester represented by general formula (1) has a molecular weight of 300 or more and 700 or less, and preferably 300 or more and 600 or less.

More specifically, the first mode of the semiconductor nanoparticle complex (A) according to the present invention is a semiconductor nanoparticle complex in which a ligand is coordinated to a surface of a semiconductor nanoparticle, in which the semiconductor nanoparticle is a core-shell type semiconductor nanoparticle including a core containing In and P and one or more layers of shells, the semiconductor nanoparticle further includes halogen, in the semiconductor nanoparticle, the molar ratio of halogen to In is 0.80 to 15.00 in terms of atoms, the ligand includes one or more kinds of mercapto fatty acid esters represented by the following general formula (1):

HS—$R_1$—COO—$R_2$ (1)

(where $R_1$ is a $C_{1-3}$ alkylene group and $R_2$ is a hydrophilic group), the mercapto fatty acid ester has an SP value of 9.20 or more, the mercapto fatty acid ester has a molecular weight of 300 or more and 700 or less, and preferably 300 or more and 600 or less, and the average SP value of the entire ligand is 9.10 to 11.00. When the molecular weight of the mercapto fatty acid ester represented by general formula (1) falls within the range above, steric hindrance sufficient for the semiconductor nanoparticles to be dispersed in an organic solvent is ensured, dispersion at a higher concentration becomes possible, and heat resistance of the semiconductor nanoparticle complex is enhanced. In the present invention, heat resistance means that when the semiconductor nanoparticle complex is thermally treated in a certain temperature, the semiconductor nanoparticle complex can be dispersed again, even after the thermal treatment, in a solvent in which it is dispersed before the thermal treatment.

In an embodiment of evaluation of heat resistance, it is determined whether the semiconductor nanoparticle complex is dispersible in a good solvent after the semiconductor nanoparticle complex is treated in the atmosphere at 180° C. for one hour. The dispersibility of a semiconductor nanoparticle complex with insufficient heat resistance in a good solvent after heating is significantly deteriorated due to denaturation or elimination of the ligand.

In the first mode of the semiconductor nanoparticle complex (A) according to the present invention, the mass ratio of the ligand to the semiconductor nanoparticle (ligand/semiconductor nanoparticle) is preferably 1.00 or less, and further preferably 0.70 or less. With the mass ratio of the ligand to the semiconductor nanoparticle (ligand/semiconductor nanoparticle) within the range above, the semiconductor nanoparticles can be dispersed at a high concentration in a polar solvent while the heat resistance of the semiconductor nanoparticle complex is retained.

In the first mode of the semiconductor nanoparticle complex (A) according to the present invention, the mass ratio of the ligand to the semiconductor nanoparticle (ligand/semiconductor nanoparticle) is preferably 0.40 or more. With the mass ratio of the ligand to the semiconductor nanoparticle (ligand/semiconductor nanoparticle) within the range above, the semiconductor nanoparticles can be dispersed at a high concentration in a polar solvent while the heat resistance of the semiconductor nanoparticle complex is retained.

The semiconductor nanoparticle complex (A) according to the present invention includes the following second mode. The second mode of the semiconductor nanoparticle complex (A) according to the present invention is the semiconductor nanoparticle complex (A) according to the present invention in which the mercapto fatty acid ester represented by general formula (1) has a molecular weight of less than 300.

More specifically, the second mode of the semiconductor nanoparticle complex (A) according to the present invention is a semiconductor nanoparticle complex in which a ligand is coordinated to a surface of a semiconductor nanoparticle, in which
the semiconductor nanoparticle is a core-shell type semiconductor nanoparticle including a core containing In and P and one or more layers of shells,
the semiconductor nanoparticle further includes halogen, in the semiconductor nanoparticle, the molar ratio of halogen to In is 0.80 to 15.00 in terms of atoms,
the ligand includes one or more kinds of mercapto fatty acid esters represented by the following general formula (1):

$$HS—R_1—COO—R_2 \quad (1)$$

(where $R_1$ is a $C_{1-3}$ alkylene group and $R_2$ is a hydrophilic group),
the mercapto fatty acid ester has an SP value of 9.20 or more, the mercapto fatty acid ester has a molecular weight of less than 300, and preferably 100 or more and less than 300, and
the average SP value of the entire ligand is 9.10 to 11.00. When the molecular weight of the mercapto fatty acid ester represented by general formula (1) falls within the range above, the viscosity of a dispersion liquid in which the semiconductor nanoparticle complex is dispersed at a high mass fraction can be reduced. In the present invention, a low viscosity of a dispersion liquid in which the semiconductor nanoparticle complex is dispersed at a high mass fraction means that when the semiconductor nanoparticle complex is dispersed in isobornyl acrylate at 30.0 mass % in terms of the mass ratio of semiconductor nanoparticles, the viscosity at 25° C. is 30 cp or less.

In the second mode of the semiconductor nanoparticle complex (A) according to the present invention, the mass ratio of the ligand to the semiconductor nanoparticle (ligand/semiconductor nanoparticle) is preferably 0.40 or less. With the mass ratio of the ligand to the semiconductor nanoparticle (ligand/semiconductor nanoparticle) within the range above, the semiconductor nanoparticles can be dispersed at a high concentration in a polar solvent while increase in viscosity of the dispersion liquid in which the semiconductor nanoparticle complex is dispersed is suppressed.

A semiconductor nanoparticle complex (B) according to the present invention is a semiconductor nanoparticle complex obtained by bringing a surface-modifying compound into contact with a semiconductor nanoparticle, the surface-modifying compound having a bonding group to be bonded to the semiconductor nanoparticle at one end side, the semiconductor nanoparticle being a core-shell type semiconductor nanoparticle including a core containing In and P and one or more layers of shells and further including halogen, the molar ratio of halogen to In being 0.80 to 15.00 in terms of atoms, in which
the surface-modifying compound includes one or more kinds of mercapto fatty acid esters represented by the following general formula (1):

$$HS—R_1—COO—R_2 \quad (1)$$

(where $R_1$ is a $C_{1-3}$ alkylene group and $R_2$ is a hydrophilic group),
the mercapto fatty acid ester has an SP value of 9.20 or more, the mercapto fatty acid ester has a molecular weight of 700 or less, and
the average SP value of the entire surface-modifying compound is 9.10 to 11.00.

The semiconductor nanoparticle complex (B) according to the present invention is a semiconductor nanoparticle complex obtained by bringing a surface-modifying compound having a bonding group to be bonded to a semiconductor nanoparticle at one end side into contact with the semiconductor nanoparticle. The surface-modifying compound may be brought into contact with the semiconductor nanoparticle by any method, for example, by adding the surface-modifying compound to a dispersion liquid of the semiconductor nanoparticles. Adding a surface-modifying compound may be accompanied by heating and stirring, depending on the bonding force of the surface-modifying compound to the semiconductor nanoparticle.

The semiconductor nanoparticle in the semiconductor nanoparticle complex (B) according to the present invention is similar to the semiconductor nanoparticle in the semiconductor nanoparticle complex (A) according to the present invention.

Examples of the bonding group in the surface-modifying compound having a bonding group to be bonded to the semiconductor nanoparticle at one end side include a thiol group, a carboxylic acid group, a phosphine group, a phosphine oxide group, and an amine group. The surface-modifying compound having a bonding group to the semiconductor nanoparticle at one end side includes the ligand in the semiconductor nanoparticle complex (A) according to the present invention.

The semiconductor nanoparticle complex (B) according to the present invention includes a mercapto fatty acid ester represented by the following general formula (1) as the surface-modifying compound having a bonding group to be bonded to the semiconductor nanoparticle at one end side.

$$HS—R_1—COO—R_2 \quad (1)$$

In the semiconductor nanoparticle complex (B) according to the present invention, the mercapto fatty acid ester represented by the general formula (1) that is the surface-modifying compound is similar to the mercapto fatty acid ester represented by general formula (1) in the semiconductor nanoparticle complex (A) according to the present invention.

In the semiconductor nanoparticle complex (B) according to the present invention, with the use of the mercapto fatty acid ester represented by the general formula (1) as a surface-modifying compound, a semiconductor nanoparticle complex having high fluorescence quantum yield and a narrow full width at half maximum can be obtained.

In the semiconductor nanoparticle complex (B) according to the present invention, the molecular weight of the mercapto fatty acid ester represented by general formula (1) is 700 or less. When the molecular weight of the mercapto fatty acid ester represented by general formula (1) is 700 or less, the semiconductor nanoparticles can be dispersed at a high concentration in a polar solvent.

In the semiconductor nanoparticle complex (B) according to the present invention, the SP value of the mercapto fatty acid ester represented by general formula (1) is 9.20 or more, and preferably 9.20 to 12.00. With the SP value within the range above, the semiconductor nanoparticles can be dispersed in a polar solvent.

The semiconductor nanoparticle complex (B) according to the present invention may include a surface-modifying compound other than the mercapto fatty acid ester represented by general formula (1) as a surface-modifying compound having a bonding group to be bonded to the semiconductor nanoparticle at one end side. Such a surface-modifying compound other than the mercapto fatty acid ester represented by general formula (1) may be any compound having a bonding group to be bonded to the semiconductor nanoparticle at one end side, and which can be used as a surface-modifying compound for the semiconductor nanoparticle and can adjust the average SP value of the entire surface-modifying compound to 9.20 to 11.00, and preferably 9.20 to 10.00, in combination with the mercapto fatty acid ester represented by general formula (1).

The SP value of the surface-modifying compound other than the mercapto fatty acid ester represented by general formula (1) is preferably, but not limited to, 7.00 to 15.00, and particularly preferably 7.50 to 15.00.

The average SP value of the entire surface-modifying compound having a bonding group to be bonded to the semiconductor nanoparticle at one end side is 9.20 to 11.00, and preferably 9.20 to 10.00. When the average SP value of the entire surface-modifying compound having a bonding group to be bonded to a semiconductor nanoparticle at one end side falls within the range above, the semiconductor nanoparticles can be dispersed in a polar solvent.

The surface-modifying compound other than the mercapto fatty acid ester represented by general formula (1) is preferably an aliphatic group-containing surface-modifying compound having a bonding group to be bonded to the semiconductor nanoparticle at one end side and having an aliphatic group at the other end side. With inclusion of an aliphatic group-containing surface-modifying compound as the surface-modifying compound, the semiconductor nanoparticles can be dispersed at a high concentration in a polar solvent. Furthermore, the semiconductor nanoparticles can be dispersed in an organic solvent with an SP value in a wider range. When the semiconductor nanoparticle complex is applied to a composition and a dispersion liquid described later, the choice of the dispersion medium can be widened.

Examples of the aliphatic group-containing surface-modifying compound include aliphatic thiols, aliphatic carboxylic acids, aliphatic phosphines, aliphatic phosphine oxides, and aliphatic amines. The aliphatic group-containing surface-modifying compound is preferably one or more kinds selected from the group consisting of aliphatic thiols, aliphatic carboxylic acids, and aliphatic phosphines in terms of the strength of coordination force to the semiconductor nanoparticle. The aliphatic group of the aliphatic group-containing surface-modifying compound may include a substituent or a heteroatom.

The amount of the mercapto fatty acid ester represented by general formula (1) contained in the entire surface-modifying compound having a bonding group to be bonded to the semiconductor nanoparticle at one end side is preferably 40 mol % or more, more preferably 50 mol % or more, and further preferably 60 mol % or more. When the amount of the mercapto fatty acid ester represented by general formula (1) contained in the entire surface-modifying compound having a bonding group to be bonded to the semiconductor nanoparticle at one end side falls within the range above, the semiconductor nanoparticles can be dispersed at a high concentration in a polar solvent, and the quantum yield can be enhanced.

The semiconductor nanoparticle complex (B) according to the present invention includes the following first mode. The first mode of the semiconductor nanoparticle complex (B) according to the present invention is the semiconductor nanoparticle complex (B) according to the present invention in which the mercapto fatty acid ester represented by general formula (1) has a molecular weight of 300 or more and 700 or less, and preferably 300 or more and 600 or less.

More specifically, the first mode of the semiconductor nanoparticle complex (B) according to the present invention is a semiconductor nanoparticle complex obtained by bringing a surface-modifying compound into contact with a semiconductor nanoparticle, the surface-modifying compound having a bonding group to be bonded to the semiconductor nanoparticle at one end side, the semiconductor nanoparticle being a core-shell type semiconductor nanoparticle including a core containing In and P and one or more layers of shells and further including halogen, the molar ratio of halogen to In being 0.80 to 15.00 in terms of atoms, in which the surface-modifying compound includes one or more kinds of mercapto fatty acid esters represented by the following general formula (1):

$$HS-R_1-COO-R_2 \quad (1)$$

(where $R_1$ is a $C_{1-3}$ alkylene group and $R_2$ is a hydrophilic group), the mercapto fatty acid ester has an SP value of 9.20 or more, the mercapto fatty acid ester has a molecular weight of 300 or more and 700 or less, and preferably 300 or more and 600 or less, and the average SP value of the entire surface-modifying compound is 9.10 to 11.00. When the molecular weight of the mercapto fatty acid ester represented by general formula (1) falls within the range above, steric hindrance sufficient for the semiconductor nanoparticles to be dispersed in an organic solvent is ensured, dispersion at a higher concentration becomes possible, and heat resistance of the semiconductor nanoparticle complex is enhanced.

In the first mode of the semiconductor nanoparticle complex (B) according to the present invention, the mass ratio of the surface-modifying compound to the semiconductor nanoparticle (surface-modifying compound/semiconductor nanoparticle) is preferably 1.00 or less, and further preferably 0.70 or less. With the mass ratio of the surface-modifying compound to the semiconductor nanoparticle (surface-modifying compound/semiconductor nanoparticle) within the range above, the semiconductor nanoparticles can be dispersed at a high concentration in a polar solvent while the heat resistance of the semiconductor nanoparticle complex is retained.

In the first mode of the semiconductor nanoparticle complex (B) according to the present invention, the mass ratio of the surface-modifying compound to the semiconductor nanoparticle (surface-modifying compound/semiconductor nanoparticle) is preferably 0.40 or more. With the mass ratio of the surface-modifying compound to the semiconductor nanoparticle (surface-modifying compound/semiconductor nanoparticle) within the range above, the semiconductor nanoparticles can be dispersed at a high concentration in a polar solvent while the heat resistance of the semiconductor nanoparticle complex is retained.

The semiconductor nanoparticle complex (B) according to the present invention includes the following second mode. The second mode of the semiconductor nanoparticle complex (B) according to the present invention is the semiconductor nanoparticle complex (B) according to the present invention in which the mercapto fatty acid ester represented by general formula (1) has a molecular weight of less than 300.

More specifically, the second mode of the semiconductor nanoparticle complex (B) according to the present invention is a semiconductor nanoparticle complex obtained by bringing a surface-modifying compound into contact with a semiconductor nanoparticle, the surface-modifying compound having a bonding group to be bonded to the semiconductor nanoparticle at one end side, the semiconductor nanoparticle being a core-shell type semiconductor nanoparticle including a core containing In and P and one or more layers of shells and further including halogen, the molar ratio of halogen to In being 0.80 to 15.00 in terms of atoms, in which the surface-modifying compound includes one or more kinds of mercapto fatty acid esters represented by the following general formula (1):

HS—R$_1$—COO—R$_2$ (1)

(where R$_1$ is a C$_{1-3}$ alkylene group and R$_2$ is a hydrophilic group), the mercapto fatty acid ester has an SP value of 9.20 or more, the mercapto fatty acid ester has a molecular weight of less than 300, and preferably 100 or more and less than 300, and the average SP value of the entire surface-modifying compound is 9.10 to 11.00. When the molecular weight of the mercapto fatty acid ester represented by general formula (1) falls within the range above, the viscosity of a dispersion liquid in which the semiconductor nanoparticle complex is dispersed can be reduced.

In the second mode of the semiconductor nanoparticle complex (B) according to the present invention, the mass ratio of the surface-modifying compound to the semiconductor nanoparticle (surface-modifying compound/semiconductor nanoparticle) is preferably 0.40 or less. With the mass ratio of the surface-modifying compound to the semiconductor nanoparticle (surface-modifying compound/semiconductor nanoparticle) within the range above, the semiconductor nanoparticles can be dispersed at a high concentration in a polar solvent while increase in viscosity of the dispersion liquid in which the semiconductor nanoparticle complex is dispersed is suppressed.

(Purification)

The semiconductor nanoparticle complex according to the present invention can be separated and purified from a reaction solution, if necessary. As a purification method, the semiconductor nanoparticle complex is aggregated using a poor solvent and subsequently the semiconductor nanoparticle complex is separated.

In an embodiment, the semiconductor nanoparticle complex can be precipitated from a dispersion liquid by adding a polar conversion solvent such as acetone. The precipitated semiconductor nanoparticle complex can be collected by filtration or centrifugation, while a supernatant including the unreacted starting material and other impurities can be discarded or reused. Subsequently, the precipitated semiconductor nanoparticle complex can be washed with a further dispersion medium and dispersed again. This purification process can be repeated, for example, two to four times or until a desired purity is reached.

In the present invention, as the purification method for the semiconductor nanoparticle complex, in addition to the method described above, for example, aggregation, liquid-liquid extraction, distillation, electrodeposition, size exclusion chromatography, and/or ultrafiltration, and any methods can be used singly or in combination.

(Semiconductor Nanoparticle Complex Dispersion Liquid)

The semiconductor nanoparticle complex according to the present invention can be dispersed in a polar dispersion medium to form a semiconductor nanoparticle complex dispersion liquid. In the present invention, a state in which the semiconductor nanoparticle complex is dispersed in a dispersion medium refers to a state in which the semiconductor nanoparticle complex is not precipitated or a state in which it does not remain as a visible turbidity (haze) when the semiconductor nanoparticle complex and the dispersion medium are mixed. The product in which the semiconductor nanoparticle complex is dispersed in a dispersion medium is referred to as the semiconductor nanoparticle complex dispersion liquid.

The semiconductor nanoparticle complex according to the present invention is dispersed in an organic dispersion medium having an SP value of 8.50 or more, further in an organic dispersion medium having an SP value of 9.00 or more, and even in an organic dispersion medium having an SP value of 10.00 or more, to form a semiconductor nanoparticle complex dispersion liquid.

As used herein the SP value is a value calculated from Hansen solubility parameters, in the same manner as the method of determining the SP value of the polar ligand. Hansen solubility parameters can be determined using a handbook, for example, the values in "Hansen Solubility Parameters: A User's Handbook", the 2nd edition, C. M. Hansen (2007) or Practice (HSPiP) program (the 2nd edition) provided by Hanson and Abbot et al. An organic dispersion medium not listed in the handbook can be determined by calculation using the Y-MB method.

In the present invention, an organic dispersion medium in the semiconductor nanoparticle complex dispersion liquid according to the present invention is selected from alcohols such as methanol, ethanol, isopropyl alcohol, and n-propyl alcohol, ketones such as acetone, methyl ethyl ketone, methyl isobutyl ketone, cyclopentanone, and cyclohexanone, esters such as methyl acetate, ethyl acetate, isopropyl acetate, n-propyl acetate, n-butyl acetate, and ethyl lactate, ethers such as diethyl ether, dipropyl ether, dibutyl ether, and tetrahydrofuran, glycol ethers such as ethylene glycol monomethyl ether, ethylene glycol monoethyl ether, diethylene glycol monomethyl ether, ethylene glycol diethyl ether, diethylene glycol dimethyl ether, propylene glycol monomethyl ether (PGME), propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether, and glycol ether esters such as ethylene glycol acetate, ethylene glycol monoethyl ether acetate, diethylene glycol monoethyl ether acetate, diethylene glycol monobutyl ether acetate, propylene glycol monomethyl ether acetate (PGMEA), and dipropylene glycol monoethyl ether acetate. The semiconductor nanoparticle complex according to the present invention is dispersed in these organic dispersion media, whereby the semiconductor nanoparticle complex can be used in applications such as a cured film and dispersion in a resin described later while the dispersibility of the semiconductor nanoparticle complex is kept.

In particular, in the semiconductor nanoparticle complex according to the present invention, polar organic dispersion media such as alcohols, glycol ethers, and glycol ether esters can be selected as an organic dispersion medium. The semiconductor nanoparticle complex according to the present invention is dispersed in these organic dispersion media, whereby the semiconductor nanoparticle complex can be used in applications such as a cured film and dispersion in a resin described later while the dispersibility of the semiconductor nanoparticle complex is kept. In particular, in the field of photoresists, PGMEA and PGME are commonly used as a diluent solvent, and if the semiconductor nanoparticle complex is dispersible in PGMEA and PGME, the semiconductor nanoparticle complex can be widely applied in the field of photoresists.

The semiconductor nanoparticle complex according to the present invention has the configuration described above, whereby the semiconductor nanoparticle complex can be dispersed at a high mass fraction in an organic dispersion medium, and consequently, the mass fraction of the semiconductor nanoparticles in the semiconductor nanoparticle complex dispersion liquid can be 20 mass % or more, further 30 mass % or more, and further 35 mass % or more.

In the present invention, a monomer can be selected as a dispersion medium of the semiconductor nanoparticle complex dispersion liquid according to the present invention. The monomer is preferably, but not limited to, a (meth)acrylic monomer by which applications of semiconductor nanoparticles can be selected widely. The (meth)acrylic monomer is selected from, depending on the applications of the semiconductor nanoparticle complex dispersion liquid, (meth)acrylic monomers such as methyl (meth)acrylate, ethyl (meth)acrylate, propyl (meth)acrylate, butyl (meth)acrylate, isobutyl (meth)acrylate, isoamyl (meth)acrylate, octyl (meth)acrylate, 2-ethylhexyl (meth)acrylate, dodecyl (meth)acrylate, isodecyl (meth)acrylate, lauryl (meth)acrylate, stearyl (meth)acrylate, cyclohexyl (meth)acrylate, isobornyl (meth)acrylate, 3,5,5-trimethylcyclohexanol (meth)acrylate, dicyclopentanyl (meth)acrylate, dicyclopentenyl (meth)acrylate, methoxyethyl (meth)acrylate, ethylcarbitol (meth)acrylate, methoxytriethylene glycol acrylate, 2-ethylhexyl diglycol acrylate, methoxypolyethylene glycol acrylate, methoxydipropylene glycol acrylate, phenoxyethyl (meth)acrylate, 2-phenoxydiethylene glycol (meth)acrylate, 2-phenoxypolyethylene glycol (meth)acrylate (n≈2), tetrahydrofurfuryl (meth)acrylate, 2-hydroxyethyl acrylate, 2-hydroxypropyl (meth)acrylate, 4-hydroxybutyl (meth)acrylate, 2-hydroxybutyl (meth)acrylate, dicyclopentanyloxylethyl (meth)acrylate, isobornyloxylethyl (meth)acrylate, adamantyl (meth)acrylate, dimethyladamantyl (meth)acrylate, dicyclopentenyloxyethyl (meth)acrylate, benzyl (meth)acrylate, ω-carboxy-polycaprolactone (n≈2) monoacrylate, 2-hydroxy-3-phenoxypropyl acrylate, 2-hydroxy-3-phenoxyethyl (meth)acrylate, (2-methyl-2-ethyl-1,3-dioxolan-4-yl)methyl (meth)acrylate, (3-ethyloxetan-3-yl) methyl (meth)acrylate, o-phenylphenolethoxy (meth)acrylate, dimethylamino (meth)acrylate, diethylamino (meth)acrylate, 2-(meth)acryloyloxyethyl phthalate, 2-(meth)acryloyloxyethyl hexahydrophthalate, glycidyl (meth)acrylate, 2-(meth)acryloyloxyethyl phosphate, acryloylmorpholine, dimethyl acrylamide, dimethylaminopropyl acrylamide, isopropyl acrylamide, diethyl acrylamide, hydroxyethyl acrylamide, and N-acryloyloxyethyl hexahydrophthalimide. These may be used singly or may be used by mixing two or more kinds. In particular, the acrylic monomer is preferably one kind or a mixture of two or more kinds selected from lauryl (meth)acrylate and 1,6-hexanediol di(meth)acrylate, depending on the applications of the semiconductor nanoparticle complex dispersion liquid.

In the present invention, a prepolymer can be selected as the dispersion medium of the semiconductor nanoparticle complex dispersion liquid according to the present invention. Examples of the prepolymer include, but not limited to, acrylic resin prepolymers, silicone resin prepolymers, and epoxy resin prepolymers.

(Semiconductor Nanoparticle Complex Composition)

In the present invention, a semiconductor nanoparticle complex composition can be formed by selecting a monomer or a prepolymer as a dispersion medium of the semiconductor nanoparticle complex dispersion liquid according to the present invention. In other words, the semiconductor nanoparticle complex composition according to the present invention is a semiconductor nanoparticle complex composition in which the semiconductor nanoparticle complex according to the present invention is dispersed in a monomer or a prepolymer. Examples of the monomer or the prepolymer include, but not limited to, radical polymerizable compounds including an ethylene unsaturated bond, siloxane compounds, epoxy compounds, isocyanate compounds, and phenol derivatives. Examples of the monomer include the monomers for use as the dispersion medium described above. Examples of the prepolymer include the prepolymers for use as the dispersion medium described above.

Furthermore, the semiconductor nanoparticle complex composition according to the present invention can include a crosslinking agent. The crosslinking agent is selected from polyfunctional (meth)acrylates, polyfunctional silane compounds, polyfunctional amines, polyfunctional carboxylic acids, polyfunctional thiols, polyfunctional alcohols, polyfunctional isocyanates, and the like, depending on the kind of monomer in the semiconductor nanoparticle complex composition according to the present invention.

Furthermore, the semiconductor nanoparticle complex composition according to the present invention may further include a variety of organic solvents that do not influence curing, such as aliphatic hydrocarbons such as pentane, hexane, cyclohexane, isohexane, heptane, octane, and petroleum ethers, alcohols, ketones, esters, glycol ethers, glycol ether esters, aromatic hydrocarbons such as benzene, toluene, xylene, and mineral spirits, and alkyl halides such as dichloromethane and chloroform. The organic solvents above can be used not only for dilution of the semiconductor nanoparticle complex composition but also as an organic dispersion medium. In other words, the semiconductor nanoparticle complex according to the present invention can be dispersed in the organic solvents above to form a semiconductor nanoparticle complex dispersion liquid.

In addition, the semiconductor nanoparticle complex composition according to the present invention may include an initiator, a scattering agent, a catalyst, a binder, a surfactant, an adhesion promotor, an antioxidant, a UV absorber, an aggregation inhibitor, and a dispersant, as appropriate depending on the kind of monomer in the semiconductor nanoparticle complex composition.

The semiconductor nanoparticle complex composition may further include a scattering agent in order to enhance the optical properties of the semiconductor nanoparticle complex composition according to the present invention or a semiconductor nanoparticle complex cured film according to the present invention described later. The scattering agent is a metal oxide such as titanium oxide and zinc oxide, and the particle size thereof is preferably 100 nm to 500 nm. In view of the scattering effect, the particle size of the scattering agent is further preferably 200 nm to 400 nm. The inclusion of the scattering agent improves the absorbance roughly twice. The amount of the scattering agent contained in the semiconductor nanoparticle complex composition according to the present invention is preferably 2 mass % to 30 mass % with respect to the composition, and more preferably 5 mass % to 20 mass % in view of keeping the pattern characteristics of the composition.

With the configuration of the semiconductor nanoparticle complex according to the present invention, the mass fraction of semiconductor nanoparticles in the semiconductor nanoparticle complex composition according to the present invention can be 30 mass % or more. When the mass fraction of semiconductor nanoparticles in the semiconductor nanoparticle complex composition is 30 mass % to 95 mass %, the semiconductor nanoparticle complex and the semiconductor nanoparticles can be dispersed at a high mass fraction even in the cured film described later.

When the semiconductor nanoparticle complex composition according to the present invention is formed in a film of 10 μm, the absorbance for light having a wavelength of 450 nm normal to the film is preferably 1.0 or more, more preferably 1.3 or more, and further preferably 1.5 or more. With this, light from a backlight can be efficiently absorbed, so that the thickness of the cured film described later can be reduced to miniaturize devices in applications.

(Diluted Composition)

A diluted composition is produced by diluting the semiconductor nanoparticle complex composition according to the present invention with an organic solvent.

Examples of the organic solvent to dilute the semiconductor nanoparticle complex composition include, but not limited to, aliphatic hydrocarbons such as pentane, hexane, cyclohexane, isohexane, heptane, octane, and petroleum ethers, alcohols, ketones, esters, glycol ethers, glycol ether esters, aromatic hydrocarbons such as benzene, toluene, xylene, and mineral spirits, and alkyl halides such as dichloromethane and chloroform. Among these, glycol ethers and glycol ether esters are preferable in view of the solubility in a wide variety of resins and the film uniformness in coating.

(Semiconductor Nanoparticle Complex Cured Film)

A semiconductor nanoparticle complex cured film according to the present invention refers to a film containing the semiconductor nanoparticle complex according to the present invention and being cured. The semiconductor nanoparticle complex cured film according to the present invention can be obtained by curing the semiconductor nanoparticle complex composition or the diluted composition into a film.

The semiconductor nanoparticle complex cured film according to the present invention includes a semiconductor nanoparticle and a ligand coordinated to a surface of the semiconductor nanoparticle in the semiconductor nanoparticle complex according to the present invention, and a polymer matrix. In other words, the semiconductor nanoparticle complex cured film according to the present invention is a cured film in which the semiconductor nanoparticle complex according to the present invention is dispersed in a polymer matrix.

Examples of the polymer matrix include, but not limited to, (meth)acrylic resins, silicone resins, epoxy resins, silicone resins, maleic resins, butyral resins, polyester resins, melamine resins, phenolic resins, and polyurethane resins. The semiconductor nanoparticle complex cured film according to the present invention may be obtained by curing the semiconductor nanoparticle complex composition according to the present invention. The semiconductor nanoparticle complex cured film according to the present invention may further include a crosslinking agent.

The film can be cured by, but not limited to, any methods suitable for the composition forming a film, such as thermal treatment and ultraviolet treatment.

It is preferable that the semiconductor nanoparticle and the ligand coordinated to the surface of the semiconductor nanoparticle that are included in the semiconductor nanoparticle complex cured film according to the present invention compose the semiconductor nanoparticle complex according to the present invention described above. The semiconductor nanoparticle complex included in the semiconductor nanoparticle complex cured film according to the present invention is configured as described above, whereby the semiconductor nanoparticle complex can be dispersed at a higher mass fraction in the cured film. The mass fraction of the semiconductor nanoparticles in the semiconductor nanoparticle complex cured film is preferably 30 mass % or more, and further more preferably 40 mass % or more. However, with 70 mass % or more, the amount of the composition that composes the film is reduced to make it difficult to cure and form a film.

Since the semiconductor nanoparticle complex cured film according to the present invention contains a high mass fraction of the semiconductor nanoparticle complex, the absorbance of the semiconductor nanoparticle complex cured film can be increased. When the semiconductor nanoparticle complex cured film according to the present invention has a thickness of 10 μm, the absorbance is preferably 1.0 or more, more preferably 1.3 or more, and further preferably 1.5 or more, for light having a wavelength of 450 nm vertical to the semiconductor nanoparticle complex cured film.

Furthermore, since the semiconductor nanoparticle complex cured film according to the present invention contains the semiconductor nanoparticle complex having high luminous properties, the semiconductor nanoparticle complex cured film having high luminous properties can be provided. The fluorescence quantum yield of the semiconductor nanoparticle complex cured film according to the present invention is preferably 70% or higher, and further preferably 80% or higher.

The thickness of the semiconductor nanoparticle complex cured film according to the present invention is preferably 50 μm or less, more preferably 20 μm or less, and further preferably 10 μm or less, in order to miniaturize the devices employing the semiconductor nanoparticle complex cured film.

(Semiconductor Nanoparticle Complex Patterning Film and Display Device)

A semiconductor nanoparticle complex patterning film can be obtained by patterning the semiconductor nanoparticle complex composition or the diluted composition into a film. The method of patterning the semiconductor nanoparticle complex composition and the diluted composition is not limited, and examples thereof include spin coating, bar coating, inkjet, screen printing, and photolithography.

A display device is formed using the semiconductor nanoparticle complex patterning film. For example, a display device having excellent fluorescence quantum yield can be provided by using the semiconductor nanoparticle complex patterning film as a wavelength conversion layer.

The configurations and/or methods described in the present description are illustrated by way of example and susceptible to a number of modifications, and it is understood that these specific examples or examples should not be taken in any limitative sense. The specific procedure or method described in the present description may represent one of a number of process methods. Various actions explained and/or described can be performed in the order of description and/or explanation, or can be omitted. Similarly, the order of the method can be changed.

The subject of the present disclosure includes all novel and non-obvious combinations and subsidiary combinations of a variety of methods, systems, and configurations disclosed in the present description as well as other features, functions, actions, and/or characteristics, and all equivalents thereof.

EXAMPLES

Although the present invention will be described in detail below with examples and comparative examples, the present invention is not limited to these examples.

(Ligand)

A single ligand for use in Examples and Comparative Examples was produced as follows. Hereinafter, PEG refers to a polyethylene glycol chain and a structure represented by "—$(CH_2CH_2O)_n$—$CH_3$".

<Production of Single Ligand>

(Method of Preparing 1,1-Dimethyl-3-Oxobutyl Mercaptopropionate)

In a flask, 4.2 g of 3-mercaptopropionic acid (40 mmol), 4.7 g of diacetone alcohol (40 mmol), 5.4 g of 1-hydroxybenzotriazole (40 mmol), 100 mL of methylene chloride, and 7.7 g of 1-ethyl-3-(3-dimethylaminopropyl)carbodiimide hydrochloride (40 mmol) were mixed in a nitrogen atmosphere. After the solution was allowed to react at room temperature for 60 minutes, the reaction solution was put into a separating funnel and washed using saturated sodium bicarbonate water, water, and saturated saline water successively. The resultant organic phase was dried using magnesium sulfate and then filtered and concentrated by evaporation. This concentrate was purified by column chromatography with hexane and ethyl acetate as a developing solvent to produce a ligand of interest (1,1-dimethyl-3-oxobutyl mercaptopropionate).

(Method of Preparing Thioglycolic Acid PEG Ester (Molecular Weight 470))

In a flask, 3.7 g of thioglycolic acid (40 mmol), 19.2 g of methoxy PEG-OH (molecular weight 400, 48 mmol), and 0.2 g of concentrated sulfuric acid were mixed in a nitrogen atmosphere. While the solution was stirred at 60° C., the pressure was reduced to 30 mmHg or lower to allow the solution to react for 24 hours. The reaction solution was cooled to room temperature and then dissolved in toluene and washed using saturated sodium bicarbonate water, water, and saturated saline water successively. The resultant organic phase was dried using magnesium sulfate, and then the organic phase was filtered and concentrated by evaporation to produce a ligand of interest (thioglycolic acid PEG ester, molecular weight 470).

(Method of Preparing Thioglycolic Acid PEG Ester (Molecular Weight 760))

Thioglycolic acid PEG ester having a molecular weight of 760 was obtained by replacing methoxy PEG-OH (molecular weight 400, 48 mmol) with methoxy PEG-OH (molecular weight 690, 48 mmol) and performing preparation in the same manner as described above.

(Method of Preparing 3-Mercaptopropionic Acid PEG Ester (Molecular Weight 550))

In a flask, 4.2 g of 3-mercaptopropionic acid (40 mmol), 21.6 g of methoxy PEG-OH (molecular weight 450, 48 mmol), and 0.2 g of concentrated sulfuric acid were mixed in a nitrogen atmosphere. While the solution was stirred at 60° C., the pressure was reduced to 30 mmHg or lower to allow the solution to react for 24 hours. The reaction solution was cooled to room temperature and then dissolved in toluene and washed using saturated sodium bicarbonate water, water, and saturated saline water successively. The resultant organic phase was dried using magnesium sulfate, and then the organic phase was filtered and concentrated by evaporation to produce a ligand of interest (3-mercaptopropionic acid PEG ester, molecular weight 550).

(Method of Preparing 3-Mercaptopropionic Acid PEG Ester (molecular weight 640))

By replacing methoxy PEG-OH (molecular weight 450, 48 mmol) with methoxy PEG-OH (molecular weight 550, 48 mmol) and performing preparation in the same manner as described above, 3-Mercaptopropionic acid PEG ester having a molecular weight of 760 was obtained.

(Method of Preparing 2-[2-(2-Acetoxyethoxy)Ethoxy]Ethyl 3-Mercaptopropionate)

In a flask, 2.1 g of 3-mercaptopropionic acid (20 mmol), 1.2 g of acetic acid (20 mmol), 7.2 g of triethylene glycol (48 mmol), 100 mL of toluene, and 0.2 g of concentrated sulfuric acid were mixed in a nitrogen atmosphere. A Dean-Stark apparatus was attached to the flask, and the solution was allowed to react for 24 hours while being stirred at 110° C. The reaction solution was cooled to room temperature and then washed using saturated sodium bicarbonate water, water, and saturated saline water successively. The resultant organic phase was dried using magnesium sulfate and then filtered and concentrated by evaporation. This concentrate was purified by column chromatography with hexane and ethyl acetate as a developing solvent to produce a ligand of interest (2-[2-(2-acetoxyethoxy)ethoxy]ethyl 3-mercaptopropionate).

(Method of Preparing 6-Mercaptohexanoic Acid PEG Ester)

In a flask, 5.9 g of 6-mercaptohexanoic acid (40 mmol), 19.2 g of methoxy PEG-OH (molecular weight 400, 48 mmol), and 0.2 g of concentrated sulfuric acid were mixed in a nitrogen atmosphere. While the solution was stirred at 60° C., the pressure was reduced to 30 mmHg or lower to allow the solution to react for 24 hours. The reaction solution was cooled to room temperature and then dissolved in toluene and washed using saturated sodium bicarbonate water, water, and saturated saline water successively. The resultant organic phase was dried using magnesium sulfate, and then the organic phase was filtered and concentrated by evaporation to produce a ligand of interest (6-mercaptohexanoic acid PEG ester, molecular weight 530).

(Method of Preparing 2-[2-(2-Levulinoxyethoxy)Ethoxy]Ethyl 3-Mercaptopropionate)

In a flask, 2.1 g of 3-mercaptopropionic acid (20 mmol), 2.3 g of levulinic acid (20 mmol), 6.0 g of triethylene glycol (40 mmol), 5.4 g of 1-hydroxybenzotriazole (40 mmol), 100 mL of methylene chloride, and 7.7 g of 1-ethyl-3-(3-dimethylaminopropyl)carbodiimide hydrochloride (40 mmol) were mixed in a nitrogen atmosphere. After the solution was allowed to react at room temperature for 60 minutes, the reaction solution was put into a separating funnel and washed using saturated sodium bicarbonate water, water, and saturated saline water successively. The resultant organic phase was dried using magnesium sulfate and then filtered and concentrated by evaporation. This concentrate was purified by column chromatography with hexane and ethyl acetate as a developing solvent to produce a ligand of interest (2-[2-(2-levulinoxyethoxy)ethoxy]ethyl 3-mercaptopropionate).

(Method of Preparing 2-[2-[2-(2-Hexyloxyethoxy)Ethoxy]Ethoxy]Ethyl 3-Mercaptopropionate)

In a flask, 4.2 g of 3-mercaptopropionic acid (40 mmol), 13.4 g of a tetraethylene glycol monohexyl ether (48 mmol), 100 mL of toluene, and 0.2 g of concentrated sulfuric acid were mixed in a nitrogen atmosphere. A Dean-Stark apparatus was attached to the flask, and the solution was allowed to react for 24 hours while being stirred at 110° C. The reaction solution was cooled to room temperature and then washed using saturated sodium bicarbonate water, water, and saturated saline water successively. The resultant organic phase was dried using magnesium sulfate and then filtered and concentrated by evaporation. This concentrate was purified by column chromatography with hexane and ethyl acetate as a developing solvent to produce a ligand of interest (2-[2-[2-(2-hexyloxyethoxy)ethoxy]ethoxy]ethyl 3-mercaptopropionate).

Example 1

An InP-based semiconductor nanoparticle complex was produced according to the following method.

<Production of Core Particles>

Indium acetate (0.3 mmol) and zinc oleate (0.6 mmol) were added to a mixture of oleic acid (0.9 mmol), 1-dodecanethiol (0.1 mmol), and octadecene (10 mL), and the mixture was heated under vacuum (<20 Pa) to about 120° C. and allowed to react for one hour. The mixture allowed to react under vacuum was introduced into a nitrogen atmosphere at 25° C., and after addition of tris(trimethylsilyl) phosphine (0.2 mmol), heated to about 300° C. and allowed to react for 10 minutes. The reaction liquid was cooled to 25° C., and octanoic acid chloride (1.1 mmol) was injected. The liquid was heated at about 250° C. for 30 minutes, followed by cooling to 25° C. to obtain a dispersion liquid of InP-based semiconductor nanoparticles.

(Precursors for Shell Forming)

In production of a shell, the following precursors were first prepared.

(Preparation of Zn Precursor Solution)

A Zn precursor of [Zn]=0.4 M was prepared by mixing 40 mmol of zinc oleate and 75 mL of octadecene and heating the mixture under vacuum at 110° C. for one hour.

(Preparation of Se Precursor (Trioctylphosphine Selenide))

Trioctylphosphine selenide of [Se]=2.2 M was produced by mixing 22 mmol of selenium powder and 10 ml of trioctylphosphine in nitrogen and stirring the mixture until completely dissolved.

(Preparation of S Precursor (Trioctylphosphine Sulfide))

Trioctylphosphine sulfide of [S]=2.2 M was produced by mixing 22 mmol of sulfur powder and 10 mL of trioctylphosphine in nitrogen and stirring the mixture until completely dissolved.

Using the precursors obtained as described above, a shell was formed on the surface of the InP-based semiconductor nanoparticle (core) as follows.

(Formation of Shell)

A dispersion liquid of the core was heated to 200° C. At 250° C., 6.0 mL of the Zn precursor solution and 2.0 mL of trioctylphosphine selenide were added and allowed to react for 30 minutes to form a ZnSe shell on a surface of the InP-based semiconductor nanoparticle. Furthermore, 4.0 mL of the Zn precursor solution and 1.8 mL of trioctylphosphine sulfide were added, and the temperature was increased to 280° C. to allow the solution to react for one hour to form a ZnS shell.

The resultant semiconductor nanoparticle was observed by STEM-EDS, and the presence of a core/shell structure was confirmed.

To a solution in which semiconductor nanoparticles having a core-shell structure obtained by synthesis were dispersed, dehydrated acetone was added to aggregate the semiconductor nanoparticles. Subsequently, after centrifugation (4,000 rpm, for 10 minutes), a supernatant was removed, and the semiconductor nanoparticles were dispersed again in hexane. This was repeated to provide purified semiconductor nanoparticles.

(Compositional Analysis)

The elemental analysis of the semiconductor nanoparticle was performed using an inductively coupled plasma spectroscope (ICP) and an X-ray fluorescence spectrometer (XRF). In the ICP analysis, the purified semiconductor nanoparticles were dissolved with nitric acid and heated, and thereafter diluted with water and analyzed by the calibration-curve method using an ICP emission spectroscopy (ICPS-8100 manufactured by Shimadzu Corporation). In the XRF analysis, filter paper impregnated with the dispersion liquid was put into a sample holder, and quantitative analysis was performed using an X-ray fluorescence spectrometer (ZSX100e manufactured by Rigaku Corporation). The molar ratio of halogen to In in the semiconductor nanoparticle was listed in Table 1.

(Production of Semiconductor Nanoparticle Complex)

In a flask, a semiconductor nanoparticle 1-octadecene dispersion liquid was prepared by dispersing the purified semiconductor nanoparticles in the amount of 10 mass % by mass ratio in 1-octadecene. In a flask, 10.0 g of the prepared semiconductor nanoparticle 1-octadecene dispersion liquid was charged, and 3.6 g of thioglycolic acid PEG ester (molecular weight 470) as a mercapto fatty acid ester and 0.4 g of dodecanethiol as a nonpolar ligand were added. The mixture was stirred in a nitrogen atmosphere at 110° C. for 60 minutes and cooled to 25° C. to produce a semiconductor nanoparticle complex. The reaction solution including the semiconductor nanoparticle complex was put into a centrifuge tube and centrifuged at 4,000 G for 20 minutes to separate into a transparent 1-octadecene phase and a semiconductor nanoparticle complex phase. The 1-octadecene phase was removed, and the remaining semiconductor nanoparticle complex phase was collected.

To the resultant semiconductor nanoparticle complex phase, 5.0 mL of acetone was added to produce a dispersion liquid. To the resultant dispersion liquid, 50 mL of n-hexane was added, and the dispersion liquid was centrifuged at 4,000 G for 20 minutes. After the centrifugation, a transparent supernatant was removed, and a precipitate was collected. This operation was repeated several times to obtain a purified semiconductor nanoparticle complex.

<Analysis>

(Measurement of Li r nd Molecular Weight)

The molecular weight of the ligand was measured by GPC using a liquid chromatograph (LC-20: Shimadzu Corporation). The ligand was dissolved in tetrahydrofuran (THF) to produce an eluent. The eluent was injected into columns (KF-801, KF-803, and KF-805: Shodex), and the number average molecular weight was calculated from the resultant molecular weight distribution curve. At that moment, polyethylene glycol (Polyethylene glycol READY_CAL SET Mp 102-40,000: Aldrich) having a known average molecular weight was used as a standard substance.

(Fluorescence Quantum Yield Measurement)

The optical properties of the semiconductor nanoparticle complex were determined using a quantum yield measurement system (QE-2100 manufactured by Otsuka Electronics Co., Ltd.). The semiconductor nanoparticle complex obtained by synthesis was dispersed in a dispersion medium and irradiated with single light of 450 nm as excitation light to obtain an emission spectrum. The re-excitation fluorescence emission spectrum of re-excited fluorescence emission was eliminated from the obtained emission spectrum, and the fluorescence quantum yield (QY) and the full width at half maximum (FWHM) were calculated from the emission spectrum after the re-excitation correction. Propylene glycol monomethyl ether acetate (PGMEA) was used as a dispersion medium. The obtained results were listed in Table 2.

($^1$H-NMR Measurement)

For the purified semiconductor nanoparticle complex, the ligands coordinated to the semiconductor nanoparticle were analyzed using a nuclear magnetic resonance (NMR) spectrometer (JNM-LA400 manufactured by JEOL Ltd.). In the measurement of all the samples, using deuterated chloroform as a solvent and tetramethylsilane as an internal standard substance for chemical shift, $^1$H-NMR was measured. A signal attributed to the alkyl group of dodecanethiol was observed in the vicinity of 0.8 to 1.6 ppm, and a signal attributed to the polyethylene glycol skeleton was observed in the vicinity of 3.5 to 4.0 ppm from the semiconductor nanoparticle complex obtained in Example 1. The abundance ratio of each ligand was calculated based on the area ratio of these signals. Based on the abundance ratio of the ligands, the average SP value of total ligands and the ratio of mercapto fatty acid ester to total ligands were calculated. The obtained results were listed in Table 1 and Table 3.

(Thermogravimetric Analysis)

The purified semiconductor nanoparticle complex was heated to 550° C. by simultaneous thermogravimetry/differential thermal analysis (DTA-TG), held for 10 minutes, and cooled. The residual mass after analysis was considered as the mass of the semiconductor nanoparticle, and based on this value, the mass ratio of the ligand to the semiconductor nanoparticle in the semiconductor nanoparticle complex (ligand/semiconductor nanoparticle) was determined. The obtained results were listed in Table 1 and Table 3.

(Dispersibility Test)

With reference to the mass ratio, an organic dispersion medium was added to the semiconductor nanoparticle complex so that the concentration of semiconductor nanoparticles was 20.0 mass %, 30.0 mass %, and 35.0 mass %, and the dispersion state at that moment was observed. Those dispersed were denoted by "○" and those with precipitation and turbidity observed were denoted by "x" in Table 2 and Table 4. Propylene glycol monomethyl ether acetate (PGMEA) was used as a dispersion medium.

(Filterability Test)

A filterability test was conducted for the samples in which a semiconductor nanoparticle complex PGMEA dispersion liquid was able to be prepared with a concentration of semiconductor nanoparticles of 20.0 mass %. The 20 mass % semiconductor nanoparticle complex PGM EA solution was taken in a syringe in the amount of 1 mL and filtered using a PTFE syringe filter (filter diameter 13 mm) having an aperture size of 0.45 tall. Those filtered by one syringe filter were denoted by ○ and those causing clogging in the middle were denoted by x in Table 2 and Table 4.

(Heat Resistance Test)

The semiconductor nanoparticle complex was taken in a sample tube in the amount of 50 mg and heated in the atmosphere at 180° C. for 60 minutes. The sample was cooled in air to room temperature, and with addition of 1 mL of chloroform, the dispersion state at that moment was observed. Those dispersed were denoted by "○" and those with precipitation and turbidity observed were denoted by "x" in Table 2 and Table 4.

<Measurement of Viscosity>

A dispersion liquid was prepared by dispersing the semiconductor nanoparticle complex in isobornyl acrylate so that the concentration of semiconductor nanoparticles was 30.0 mass %. Subsequently, the viscosity of the resultant dispersion liquid was measured at 25° C. with an AR-2000 rheometer manufactured by TA Instruments. In the measurement, preliminary shearing was performed at 0.1 s$^{-1}$ for one minute, and then the shearing speed was changed from 0.1 s$^{-1}$ to 1,000 s$^{-1}$. Those with a viscosity of 30 cp or less at 100 s$^{-1}$ is denoted by double circle "◎", those exceeding 30 cp and 60 cp or less is denoted by "○", and those exceeding 60 cp was denoted by "x" in Table 2 and Table 4. The sample in which a 30 mass % semiconductor nanoparticle complex isobornyl acrylate dispersion liquid was unable to be prepared was hyphenated (-).

Example 2

A semiconductor nanoparticle complex was obtained by the same method as in Example 1 except that 3.2 g of 3-mercaptopropionic acid PEG ester (molecular weight 550) was used as a mercapto fatty acid ester and 0.8 g of oleic acid was used as an aliphatic ligand in the process of producing a semiconductor nanoparticle complex.

Example 3

A semiconductor nanoparticle complex was obtained by the same method as in Example 1 except that 3.2 g of thioglycolic acid PEG ester (molecular weight 470) was used as a mercapto fatty acid ester and 0.8 g of ethylhexyl 3-mercaptopropionate was used instead of an aliphatic ligand in the process of producing a semiconductor nanoparticle complex.

Example 4

A semiconductor nanoparticle complex was obtained by the same method as in Example 1 except that 6.4 g of 3-mercaptopropionic acid PEG ester (molecular weight 640) was used as a mercapto fatty acid ester and 0.8 g of dodecanethiol was used as an aliphatic ligand in the process of producing a semiconductor nanoparticle complex.

Example 5

A semiconductor nanoparticle complex was obtained by the same method as in Example 1 except that 2.8 g of thioglycolic acid PEG ester (molecular weight 470) was used as a mercapto fatty acid ester and 1.2 g of dodecanethiol was used as an aliphatic ligand in the process of producing a semiconductor nanoparticle complex.

Example 6

A semiconductor nanoparticle complex was obtained by the same method as in Example 1 except that 2.4 g of thioglycolic acid PEG ester (molecular weight 470) was used as a mercapto fatty acid ester and 1.6 g of dodecanethiol was used as an aliphatic ligand in the process of producing a semiconductor nanoparticle complex.

Example 7

A semiconductor nanoparticle complex was obtained by the same method as in Example 1 except that 0.45 mmol of octanoic acid chloride was used in production of a dispersion liquid of core particles, and that 3.6 g of 3-mercaptopropionic acid PEG ester (molecular weight 550) was used as a mercapto fatty acid ester and 0.4 g of dodecanethiol was used as an aliphatic ligand in production of a semiconductor nanoparticle complex.

Example 8

A semiconductor nanoparticle complex was obtained by the same method as in Example 1 except that 2.5 mmol of octanoic acid chloride was used in production of a dispersion liquid of core particles, and that 3.8 g of 3-mercaptopropionic acid PEG ester was used as a mercapto fatty acid ester and 0.2 g of dodecanethiol was used as an aliphatic ligand in production of a semiconductor nanoparticle complex.

Example 9

A semiconductor nanoparticle complex was obtained by the same method as in Example 1 except that 3.6 g of 2-[2-[2-(2-hexyloxyethoxy)ethoxy]ethoxy]ethyl 3-mercaptopropionate was used as a mercapto fatty acid ester and 0.4 g of dodecanethiol was used as an aliphatic ligand in the process of producing a semiconductor nanoparticle complex.

Example 10

A semiconductor nanoparticle complex was obtained by the same method as in Example 1 except that 3.8 g of 2-[2-(2-levulinoxyethoxy)ethoxy]ethyl 3-mercaptopropionate was used as a mercapto fatty acid ester and 0.2 g of dodecanethiol was used as an aliphatic ligand in the process of producing a semiconductor nanoparticle complex.

Example 11

A semiconductor nanoparticle complex was obtained by the same method as in Example 1 except that 3.6 g of 1,1-dimethyl-3-oxobutyl 3-mercaptopropionate was used as a mercapto fatty acid ester and 0.4 g of trioctylphosphine was used as an aliphatic ligand in the process of producing a semiconductor nanoparticle complex.

Example 12

A semiconductor nanoparticle complex was obtained by the same method as in Example 1 except that 0.45 mmol of octanoic acid chloride was used in production of a dispersion liquid of core particles, and that 3.2 g of 3-methoxybutyl 3-mercaptopropionate was used as a mercapto fatty acid ester and 0.8 g of dodecanethiol was used as an aliphatic ligand in production of a semiconductor nanoparticle complex.

Example 13

A semiconductor nanoparticle complex was obtained by the same method as in Example 1 except that 2.5 mmol of octanoic acid chloride was used in production of a dispersion liquid of core particles, and that 3.2 g of 1,1-dimethyl-3-oxobutyl 3-mercaptopropionate was used as a mercapto fatty acid ester and 0.8 g of dodecanethiol was used as an aliphatic ligand in production of a semiconductor nanoparticle complex.

Example 14

A semiconductor nanoparticle complex was obtained by the same method as in Example 1 except that 2.8 g of 3-methoxybutyl 3-mercaptopropionate was used as a mercapto fatty acid ester and 1.2 g of dodecanethiol was used as an aliphatic ligand in the process of producing a semiconductor nanoparticle complex.

Example 15

A semiconductor nanoparticle complex was obtained by the same method as in Example 1 except that 18 g of 2-[2-(2-acetoxyethoxy)ethoxy]ethyl 3-mercaptopropionate was used as a mercapto fatty acid ester and 0.05 g of dodecanethiol was used as an aliphatic ligand in the process of producing a semiconductor nanoparticle complex.

Example 16

A semiconductor nanoparticle complex was obtained by the same method as in Example 1 except that 2.8 g of 3-methoxybutyl 3-mercaptopropionate was used as a mercapto fatty acid ester and 1.2 g of benzenethiol was used instead of an aliphatic ligand in the process of producing a semiconductor nanoparticle complex.

Example 17

In the shell forming reaction, a ZnSe shell was formed, followed by cooling to room temperature without adding the Zn precursor solution and trioctylphosphine sulfide. A semiconductor nanoparticle complex was obtained by the same method as in Example 1 except that 3.2 g of 1,1-dimethyl-3-oxobutyl 3-mercaptopropionate was used as a mercapto fatty acid ester and 0.8 g of dodecanethiol was used as an aliphatic ligand in the process of producing a semiconductor nanoparticle complex.

Comparative Example 1

A semiconductor nanoparticle complex was obtained by the same method as in Example 1 except that 9.6 g of thioglycolic acid PEG ester (molecular weight 760) was used as a mercapto fatty acid ester and 0.8 g of dodecanethiol was used as an aliphatic ligand in the process of producing a semiconductor nanoparticle complex.

Comparative Example 2

A semiconductor nanoparticle complex was obtained by the same method as in Example 1 except that 4.5 mmol of octanoic acid chloride was used in production of a dispersion liquid of core particles, and that 3.6 g of thioglycolic acid PEG ester (molecular weight 470) was used as a mercapto fatty acid ester and 0.4 g of dodecanethiol was used as an aliphatic ligand in production of a semiconductor nanoparticle complex.

Comparative Example 3

A semiconductor nanoparticle complex was obtained by the same method as in Example 1 except that 3.2 g of 6-mercaptohexanoic acid PEG ester was used as a mercapto fatty acid ester and 0.8 g of dodecanethiol was used as an aliphatic ligand in the process of producing a semiconductor nanoparticle complex.

Comparative Example 4

A semiconductor nanoparticle complex was obtained by the same method as in Example 1 except that 2.0 g of thioglycolic acid PEG ester (molecular weight 470) was used as a mercapto fatty acid ester and 2.0 g of dodecanethiol was used as an aliphatic ligand in the process of producing a semiconductor nanoparticle complex. Chloroform was used as a solvent in the fluorescence quantum yield determination.

Comparative Example 5

A semiconductor nanoparticle complex was obtained by using 4.0 g of dodecanethiol as an aliphatic ligand without adding a mercapto fatty acid ester, stirring the mixture at 110° C. for 60 minutes in a nitrogen atmosphere, and cooling it to 25° C. The reaction solution including the semiconductor nanoparticle complex was put into a centrifuge tube and, with addition of 100 mL of acetone, centrifuged at 4,000 G for 20 minutes to separate into a transparent supernatant and a semiconductor nanoparticle complex phase. The supernatant was removed, and the remaining semiconductor nanoparticle complex phase was collected. To the resultant semiconductor nanoparticle complex phase, 5.0 mL of n-hexane was added to produce a dispersion liquid. To the resultant dispersion liquid, 50 mL of acetone was added, and the dispersion liquid was centrifuged at 4,000 G for 20 minutes. After the centrifugation, a transparent supernatant was removed, and a precipitate was collected. This operation was repeated several times. Except for this, a semiconductor nanoparticle complex was obtained by the same method as in Example 1. N-hexane was used as a solvent in the fluorescence quantum yield determination.

Comparative Example 6

A semiconductor nanoparticle complex was obtained by the same method as in Example 1 except that 0.2 mmol of octanoic acid chloride was used in production of a dispersion liquid of core particles, and that 3.2 g of 3-methoxybutyl 3-mercaptopropionate was used as a mercapto fatty acid ester and 0.8 g of dodecanethiol was used as an aliphatic ligand in production of a semiconductor nanoparticle complex.

Comparative Example 7

A semiconductor nanoparticle complex was obtained by using 3.2 g of ethylhexyl 3-mercaptopropionate as a mercapto fatty acid ester and 0.8 g of dodecanethiol as an aliphatic ligand, stirring the mixture in a nitrogen atmosphere at 110° C. for 60 minutes, and cooling it to 25° C. in the process of producing a semiconductor nanoparticle complex. The reaction solution including the semiconductor nanoparticle complex was put into a centrifuge tube and, with addition of 100 mL of acetone, centrifuged at 4,000 G for 20 minutes to separate into a transparent supernatant and a semiconductor nanoparticle complex phase. The supernatant was removed, and the remaining semiconductor nanoparticle complex phase was collected. To the resultant semiconductor nanoparticle complex phase, 5.0 mL of n-hexane was added to produce a dispersion liquid. To the resultant dispersion liquid, 50 mL of acetone was added, and the dispersion liquid wad centrifuged at 4,000 G for 20 minutes. After the centrifugation, a transparent supernatant was removed, and a precipitate was collected. This operation was repeated several times. Except for this, a semiconductor nanoparticle complex was obtained by the same method as in Example 1. Chloroform was used as a solvent in the fluorescence quantum yield determination.

Comparative Example 8

A semiconductor nanoparticle complex was obtained by the same method as in Example 1 except that 3.2 g of 2-hydroxyethyl 3-mercaptopropionate was used as a mercapto fatty acid ester and 0.8 g of trioctylphosphine was used as an aliphatic ligand in the process of producing a semiconductor nanoparticle complex. This semiconductor nanoparticle complex was not dispersed in chloroform or PGMEA, and the fluorescence quantum yield determination was unable to be conducted.

Comparative Example 9

A semiconductor nanoparticle complex was obtained by the same method as in Example 1 except that 4.5 mmol of octanoic acid chloride was used in production of a dispersion liquid of core particles, and that 3.6 g of 3-methoxybutyl 3-mercaptopropionate was used as a mercapto fatty acid ester and 0.4 g of dodecanethiol was used as an aliphatic ligand in production of a semiconductor nanoparticle complex.

Comparative Example 10

A semiconductor nanoparticle complex was obtained by the same method as in Example 1 except that octanoic acid chloride was not added in production of a dispersion liquid of core particles.

Comparative Example 11

A semiconductor nanoparticle complex was obtained by the same method as in Example 1 except that 0.3 mmol of indium chloride was added instead of indium acetate and octanoic acid chloride was not added in production of a dispersion liquid of core particles.

Indium chloride added in production of a dispersion liquid of core particles produces hydrogen chloride as a byproduct during synthesis. It has been revealed that the halogen content in the semiconductor nanoparticle is reduced in the final resultant semiconductor nanoparticle, compared with the halogen content in the semiconductor nanoparticle when a halogen precursor was added in production of a core particle dispersion liquid.

The meaning of the abbreviations used in Table 1 to Table 4 is as follows.

MPAE: mercapto fatty acid ester
QD: semiconductor nanoparticle
DDT: dodecanethiol
TOP: trioctylphosphine
EHMP: ethylhexyl 3-mercaptopropionate
PGMEA: propylene glycol monomethyl ether acetate

TABLE 1

| | Semiconductor nanoparticle | | Ligand kind | | Ligand molecular weight MPAE | SP value | | | MPAE/ total ligands [molar ratio] | Ligand/ semiconductor nanoparticle [mass ratio] |
|---|---|---|---|---|---|---|---|---|---|---|
| | Semiconductor structure | Halogen/In [molar ratio] | MPAE | Aliphatic ligand or other ligands | | MPAE | Aliphatic ligand or other ligands | Average of total ligands | | |
| Example 1 | InP/ZnSe/ZnS | 3.70 | Thioglycolic acid PEG ester | DDT | 470 | 9.60 | 8.31 | 9.47 | 0.79 | 0.59 |
| Example 2 | InP/ZnSe/ZnS | 3.80 | 3-Mercaptopropionic acid PEG ester | Oleic acid | 550 | 9.49 | 8.58 | 9.31 | 0.67 | 0.64 |
| Example 3 | InP/ZnSe/ZnS | 3.90 | Thioglycolic acid PEG ester | EHMP | 470 | 9.60 | 8.92 | 9.47 | 0.65 | 0.61 |
| Example 4 | InP/ZnSe/ZnS | 3.90 | 3-Mercaptopropionic acid PEG ester | DDT | 640 | 9.46 | 8.31 | 9.34 | 0.72 | 0.82 |
| Example 5 | InP/ZnSe/ZnS | 3.80 | Thioglycolic acid PEG ester | DDT | 470 | 9.60 | 8.31 | 9.28 | 0.56 | 0.54 |
| Example 6 | InP/ZnSe/ZnS | 3.90 | Thioglycolic acid PEG ester | DDT | 470 | 9.60 | 8.31 | 9.15 | 0.44 | 0.47 |
| Example 7 | InP/ZnSe/ZnS | 0.90 | 3-Mercaptopropioic acid PEG ester | DDT | 550 | 9.49 | 8.31 | 9.40 | 0.82 | 0.69 |
| Example 8 | InP/ZnSe/ZnS | 14.00 | 3-Mercaptopropionic acid PEG ester | DDT | 550 | 9.49 | 8.31 | 9.45 | 0.91 | 0.72 |
| Example 9 | InP/ZnSe/ZnS | 3.80 | 2-[2-[2-(2-Hexyloxyethoxy)ethoxy]ethoxy]ethyl 3-mercaptopropionate | DDT | 367 | 9.22 | 8.31 | 9.13 | 0.83 | 0.51 |
| Example 10 | InP/ZnSe/ZnS | 3.80 | 2-[2-(2-Levulinoxyethoxy)ethoxy]ethyl 3-mercaptopropionate | Octanoic acid | 336 | 10.12 | 9.71 | 10.10 | 0.89 | 0.43 |
| Example 11 | InP/ZnSe/ZnS | 3.80 | 1,1-Dimethyl-3-oxobutyl 3-mercaptopropionate | TOP | 204 | 9.61 | 7.61 | 9.41 | 0.94 | 0.28 |
| Example 12 | InP/ZnSe/ZnS | 0.90 | 3-Methoxybutyl 3-mercaptopropionate ester | DDT | 192 | 9.53 | 8.31 | 9.28 | 0.81 | 0.27 |
| Example 13 | InP/ZnSe/ZnS | 14.00 | 1,1-Dimethyl-3-oxobutyl 3-mercaptopropionate | DDT | 204 | 9.61 | 8.31 | 9.35 | 0.80 | 0.28 |
| Example 14 | InP/ZnSe/ZnS | 3.80 | 3-Methoxybutyl 3-mercaptopropionate | DDT | 192 | 9.53 | 8.31 | 9.16 | 0.71 | 0.32 |
| Example 15 | InP/ZnSe/ZnS | 3.90 | 2-[2-[2-Acetoxyethoxy)ethoxy]ethyl 3-mercaptopropionate | DDT | 280 | 10.18 | 8.31 | 10.08 | 0.93 | 0.35 |
| Example 16 | InP/ZnSe/ZnS | 3.80 | 3-Methoxybutyl 3-mercaptopropionate | Benzenethiol | 192 | 9.53 | 10.14 | 9.69 | 0.61 | 0.22 |
| Example 17 | InP/ZnSe | 3.90 | 1,1-Dimethyl-3-oxobutyl 3-mercaptopropionate | DDT | 204 | 9.61 | 8.31 | 9.35 | 0.80 | 0.28 |

TABLE 2

| | Optical properties | | Dispersibility test PGMEA | | | | Redispersibility after heat resistance test | Viscosity evaluation of dispersion liquid |
|---|---|---|---|---|---|---|---|---|
| | Fluorescence quantum yield (%) | Full width at half maximum (nm) | 20 mass % | 30 mass % | 35 mass % | Filterability | | |
| Example 1 | 91 | 34 | ○ | ○ | ○ | ○ | ○ | ○ |
| Example 2 | 87 | 33 | ○ | ○ | ○ | ○ | ○ | ○ |
| Example 3 | 88 | 33 | ○ | ○ | ○ | ○ | ○ | ○ |
| Example 4 | 90 | 33 | ○ | ○ | x | ○ | ○ | ○ |
| Example 5 | 84 | 33 | ○ | ○ | ○ | ○ | ○ | ○ |
| Example 6 | 81 | 34 | ○ | ○ | ○ | ○ | ○ | ○ |
| Example 7 | 86 | 34 | ○ | ○ | ○ | ○ | ○ | ○ |
| Example 8 | 89 | 36 | ○ | ○ | ○ | ○ | ○ | ○ |
| Example 9 | 86 | 33 | ○ | ○ | ○ | ○ | ○ | ○ |
| Example 10 | 85 | 33 | ○ | ○ | ○ | ○ | ○ | ○ |
| Example 11 | 90 | 33 | ○ | ○ | ○ | ○ | x | ⊙ |

TABLE 2-continued

| | Optical properties | | Dispersibility test PGMEA | | | | Redispersibility after heat resistance test | Viscosity evaluation of dispersion liquid |
|---|---|---|---|---|---|---|---|---|
| | Fluorescence quantum yield (%) | Full width at half maximum (nm) | 20 mass % | 30 mass % | 35 mass % | Filterability | | |
| Example 12 | 85 | 34 | ○ | ○ | ○ | ○ | x | ⊙ |
| Example 13 | 91 | 35 | ○ | ○ | ○ | ○ | x | ⊙ |
| Example 14 | 86 | 33 | ○ | ○ | ○ | ○ | x | ⊙ |
| Example 15 | 88 | 33 | ○ | ○ | ○ | ○ | x | ⊙ |
| Example 16 | 85 | 33 | ○ | ○ | x | ○ | x | ⊙ |
| Example 17 | 83 | 33 | ○ | ○ | ○ | ○ | x | ⊙ |

TABLE 3

| | Semiconductor nanoparticle complex | | | | | | | | |
|---|---|---|---|---|---|---|---|---|---|
| | Semiconductor nanoparticle | | Ligand kind | | | SP value | | | Ligand/semiconductor nanoparticle [mass ratio] |
| | Semiconductor structure | Halogen/In [molar ratio] | MPAE | Aliphatic ligand or other ligands | Ligand molecular weight MPAE | MPAE | Aliphatic ligand or other ligands | Average of total ligands | MPAE/total ligands [molar ratio] | |
| Comparative Example 1 | InP/ZnSe/ZnS | 3.90 | Thioglycolic acid PEG ester | DDT | 760 | 9.55 | 8.31 | 9.46 | 0.76 | 1.27 |
| Comparative Example 2 | InP/ZnSe/ZnS | 15.50 | Thioglycolic acid PEG ester | DDT | 470 | 9.60 | 8.31 | 9.47 | 0.79 | 0.54 |
| Comparative Example 3 | InP/ZnSe/ZnS | 3.80 | 6-Mercaptohexanic acid PEG ester | DDT | 530 | 9.13 | 8.31 | 9.05 | 0.77 | 0.59 |
| Comparative Example 4 | InP/ZnSe/ZnS | 3.90 | Thioglycolic acid PEG ester | DDT | 470 | 9.60 | 8.31 | 8.96 | 0.30 | 045 |
| Comparative Example 5 | InP/ZnSe/ZnS | 3.70 | None | DDT | — | 0.00 | 8.31 | 8.31 | — | 0.25 |
| Comparative Example 6 | InP/ZnSe/ZnS | 0.60 | 3-Methoxybutyl 3-mercaptopropionate | DDT | 192 | 9.53 | 8.31 | 9.28 | 0.81 | 0.27 |
| Comparative Example 7 | InP/ZnSe/ZnS | 3.90 | 2-Ethylhexyl 3-mercaptopropionate | DDT | 218 | 8.92 | 8.31 | 8.80 | 0.79 | 0.27 |
| Comparative Example 8 | InP/ZnSe/ZnS | 3.90 | 2-Hydroxyethyl 3-mercaptopropionate | TOP | 150 | 12.19 | 7.61 | 11.27 | 0.91 | 0.25 |
| Comparative Example 9 | InP/ZnSe/ZnS | 15.30 | 3-Methoxybutyl 3-mercaptopropionate | DDT | 192 | 9.53 | 8.31 | 9.41 | 0.90 | 0.32 |
| Comparative Example 10 | InP/ZnSe/ZnS | 0.00 | Thioglycolic acid PEG ester | DDT | 470 | 9.60 | 8.31 | 9.47 | 0.79 | 0.59 |
| Comparative Example 11 | InP/ZnSe/ZnS | 0.10 | Thioglycolic acid PEG ester | DDT | 470 | 9.60 | 8.31 | 9.47 | 0.79 | 0.59 |

TABLE 4

| | Optical properties | | Dispersibility test PGMEA | | | | Redispersibility after heat resistance test | Viscosity evaluation of dispersion liquid |
|---|---|---|---|---|---|---|---|---|
| | Fluorescence quantum yield (%) | Full width at half maximum (nm) | 20 mass % | 30 mass % | 35 mass % | Filterability | | |
| Comparative Example 1 | 85 | 33 | ○ | × | × | ○ | ○ | × |
| Comparative Example 2 | 65 | 50 | ○ | ○ | ○ | × | ○ | × |
| Comparative Example 3 | 75 | 33 | ○ | × | × | ○ | ○ | × |
| Comparative Example 4 | 74 | 33 | × | × | × | — | ○ | — |
| Comparative Example 5 | 77 | 34 | × | × | × | — | ○ | — |
| Comparative Example 6 | 72 | 39 | ○ | ○ | ○ | × | × | × |
| Comparative Example 7 | 90 | 33 | × | × | × | — | × | — |
| Comparative Example 8 | — | — | × | × | × | — | — | — |
| Comparative Example 9 | 63 | 51 | ○ | ○ | ○ | × | ○ | × |
| Comparative Example 10 | 52 | 55 | ○ | ○ | ○ | × | × | × |
| Comparative Example 11 | 64 | 52 | ○ | ○ | ○ | × | × | × |

As can be understood from the results, in Examples 1 to 17, the semiconductor nanoparticle complex has high fluorescence quantum yield (QY), has high dispersibility in a polar dispersion medium, and is dispersible at a high mass fraction.

On the other hand, the dispersibility in a polar dispersion medium is low, and dispersion at a high mass fraction is difficult in Comparative Example 5 not including a mercapto fatty acid ester, Comparative Example 1 with a mercapto fatty acid ester having a molecular weight too large, Comparative Example 3 and Comparative Example 7 with a mercapto fatty acid ester having an SP value too low, Comparative Example 4 with an average SP of the entire ligand too low, and Comparative Example 8 with an average SP value of the entire ligand too high. In Comparative Example 2, Comparative Example 6, Comparative Example 9, Comparative Example 10, and Comparative Example 11, the fluorescence quantum yield is low and filterability is also low, because halogen/In of the semiconductor nanoparticle falls out of the defined range of the present invention.

In Examples 1 to 10 in which the molecular weight of the mercapto fatty acid ester represented by general formula (1) falls within the range of 300 or more and 700 or less, it has been found that the heat resistance is high, and that the semiconductor nanoparticle complex including the mercapto fatty acid ester represented by general formula (1) having a molecular weight of 300 or more and 700 or less is particularly suitable for applications focusing on heat resistance. Examples 1 to 10 can be used in applications except those requiring a lower viscosity of a dispersion medium, although the viscosity of the dispersion liquid of Examples 1 to 10 dispersed in a dispersion medium is higher than that of Examples 11 to 17 including the mercapto fatty acid ester represented by general formula (1) with a molecular weight less than 300.

In Examples 11 to 17 in which the molecular weight of the mercapto fatty acid ester represented by general formula (1) falls within the range of 300 or less, the viscosity of the dispersion liquid is low when Examples 11 to 17 are dispersed in a dispersion medium. Based on this, it has been found that the semiconductor nanoparticle complex including a mercapto fatty acid ester represented by general formula (1) having a molecular weight of less than 300 as in Examples 11 to 17 does not have heat resistance as high as that in Examples 1 to 10 including a mercapto fatty acid ester represented by general formula (1) having a molecular weight of 300 or more and 700 or less but is suitable for applications focusing on a lower viscosity of a dispersion liquid rather than heat resistance.

REFERENCE SIGNS LIST

1, 101 blue LED
3, 103 liquid crystal
7, 8 QD patterning
9 diffusion layer
10 core
12 shell
102 QD film
104 color filter (R)
105 color filter (G)
106 color filter (B)

The invention claimed is:

1. A semiconductor nanoparticle complex comprising a ligand coordinated to a surface of a semiconductor nanoparticle, wherein
the semiconductor nanoparticle is a core-shell type semiconductor nanoparticle including a core containing In and P and one or more layers of shells,
the semiconductor nanoparticle further includes halogen, in the semiconductor nanoparticle, a molar ratio of halogen to In is 0.80 to 15.00 in terms of atoms,
the ligand includes one or more kinds of mercapto fatty acid esters represented by following general formula (1):

$$HS-R_1-COO-R_2 \quad (1)$$

(where $R_1$ is a $C_{1-3}$ alkylene group and $R_2$ is a hydrophilic group),
the mercapto fatty acid ester has an SP value of 9.20 or more, the mercapto fatty acid ester has a molecular weight of 700 or less, and
an average SP value of the entire ligand is 9.10 to 11.00.

2. The semiconductor nanoparticle complex according to claim 1, wherein the mercapto fatty acid ester represented by the general formula (1) has a molecular weight of 300 or more and 700 or less.

3. The semiconductor nanoparticle complex according to claim 2, wherein a mass ratio of the ligand to the semiconductor nanoparticle (ligand/semiconductor nanoparticle) is 1.00 or less.

4. The semiconductor nanoparticle complex according to claim 2, wherein a mass ratio of the ligand to the semiconductor nanoparticle (ligand/semiconductor nanoparticle) is 0.40 or more.

5. The semiconductor nanoparticle complex according to claim 1, wherein the mercapto fatty acid ester represented by the general formula (1) has a molecular weight of less than 300.

6. The semiconductor nanoparticle complex according to claim 5, wherein a mass ratio of the ligand to the semiconductor nanoparticle (ligand/semiconductor nanoparticle) is 0.40 or less.

7. The semiconductor nanoparticle complex according to claim 1, wherein an amount of the mercapto fatty acid ester represented by the general formula (1) contained in the entire ligand is 40 mol % or more.

8. The semiconductor nanoparticle complex according to claim 1, wherein an amount of the mercapto fatty acid ester represented by the general formula (1) contained in the entire ligand is 50 mol % or more.

9. The semiconductor nanoparticle complex according to claim 1, wherein at least one of the shells is formed of ZnSe.

10. The semiconductor nanoparticle complex according to claim 1, wherein the shells are two or more layers, and an outermost layer of the shells is formed of ZnS.

11. The semiconductor nanoparticle complex according to claim 1, wherein the shells at least include a first shell formed of ZnSe and covering an outer surface of the core and a second shell formed of ZnS and covering an outer surface of the first shell.

12. The semiconductor nanoparticle complex according to claim 1, wherein $R_2$ in the general formula (1) is any one selected from the group consisting of an oligoethylene glycol group, a polyethylene glycol group, and an alkoxy group.

13. The semiconductor nanoparticle complex according to claim 1, wherein a terminal group not bonded to a carboxyl group in $R_2$ in the general formula (1) is any one selected from the group consisting of an alkyl group, an alkenyl group, and an alkynyl group.

14. The semiconductor nanoparticle complex according to claim 1, wherein the ligand further includes an aliphatic ligand.

15. The semiconductor nanoparticle complex according to claim 14, wherein the aliphatic ligand is one or more kinds selected from the group consisting of aliphatic thiols, aliphatic carboxylic acids, and aliphatic phosphines.

16. The semiconductor nanoparticle complex according to claim 1, wherein quantum yield after purification of the semiconductor nanoparticle complex is 80% or higher.

17. The semiconductor nanoparticle complex according to claim 1, wherein a full width at half maximum of an emission spectrum of the semiconductor nanoparticle complex is 38 nm or lower.

18. A semiconductor nanoparticle complex dispersion liquid comprising the semiconductor nanoparticle complex according to claim 1 dispersed in an organic dispersion medium.

19. A semiconductor nanoparticle complex obtained by bringing a surface-modifying compound into contact with a semiconductor nanoparticle, the surface-modifying compound having a bonding group to be bonded to the semiconductor nanoparticle at one end side, the semiconductor nanoparticle being a core-shell type semiconductor nanoparticle including a core containing In and P and one or more layers of shells and further including halogen, a molar ratio of halogen to In being 0.80 to 15.00 in terms of atoms, wherein the surface-modifying compound includes one or more kinds of mercapto fatty acid esters represented by following general formula (1):

HS—$R_1$—COO—$R_2$     (1)

(where $R_1$ is a $C_{1\text{-}3}$ alkylene group and $R_2$ is a hydrophilic group), the mercapto fatty acid ester has an SP value of 9.20 or more, the mercapto fatty acid ester has a molecular weight of 700 or less, and an average SP value of the entire surface-modifying compound is 9.10 to 11.00.

20. The semiconductor nanoparticle complex according to claim 19, wherein the surface-modifying compound further includes an aliphatic group-containing surface-modifying compound having a bonding group to be bonded to the semiconductor nanoparticle at one end side and an aliphatic group at another end side.

* * * * *